(12) United States Patent
Hong

(10) Patent No.: US 10,579,104 B2
(45) Date of Patent: Mar. 3, 2020

(54) RIGIDIFIABLE FLEXIBLE DEVICE

(71) Applicant: Dae-Geon Hong, Gyeonggi-Do (KR)

(72) Inventor: Dae-Geon Hong, Gyeonggi-Do (KR)

(*) Notice: Subject to any disclaimer, the term of this patent is extended or adjusted under 35 U.S.C. 154(b) by 0 days.

(21) Appl. No.: 16/117,229

(22) Filed: Aug. 30, 2018

(65) Prior Publication Data

US 2019/0086964 A1 Mar. 21, 2019

Related U.S. Application Data

(63) Continuation of application No. PCT/KR2018/003131, filed on Mar. 16, 2018.

(30) Foreign Application Priority Data

Aug. 7, 2017 (KR) .................. 10-2017-0099704

(51) Int. Cl.
*G06F 1/16* (2006.01)
*G02F 1/1333* (2006.01)
(Continued)

(52) U.S. Cl.
CPC .......... *G06F 1/1652* (2013.01); *A44C 5/0007* (2013.01); *A44C 5/0053* (2013.01); *A44C 5/022* (2013.01); *A44C 5/14* (2013.01); *G02F 1/133305* (2013.01); *G04G 17/045* (2013.01); *G04G 17/08* (2013.01); *G04G 21/08* (2013.01);
(Continued)

(58) Field of Classification Search
CPC ........ G06F 1/1652; G06F 1/163; G09F 9/301; A61B 5/681; A44C 5/0053
See application file for complete search history.

(56) References Cited

U.S. PATENT DOCUMENTS

| 2,508,147 A * | 5/1950 | Dutch .................... A44B 19/26 24/390 |
| 2013/0001263 A1* | 1/2013 | Kai ...................... A44C 5/0007 224/219 |

(Continued)

FOREIGN PATENT DOCUMENTS

| JP | H06-061113 U | 8/1994 |
| JP | 2006-346086 A | 12/2006 |

(Continued)

OTHER PUBLICATIONS

International Search Report dated Jun. 25, 2018.

*Primary Examiner* — Yuzhen Shen
(74) *Attorney, Agent, or Firm* — Bacon & Thomas, PLLC

(57) ABSTRACT

A rigidifiable flexible device includes a flexible member having flexibility, a plurality of movable members arranged in a line on a path between one end and the other end of the flexible member along a longitudinal direction of the flexible member, the movable members being movable on the path, a stopper provided at the one end of the flexible member and configured to prevent the movable members from being removed from the path beyond the one end of the flexible member, and a blocking member configured to prevent the movable members from being removed from the path beyond the other end of the flexible member. The length of a portion of the path between the blocking member and the stopper is adjustable so that the movable members are brought into close contact with each other on the path to form an integrated support body.

29 Claims, 28 Drawing Sheets

(51) Int. Cl.
  *G06F 3/041* (2006.01)
  *H04M 1/02* (2006.01)
  *G09F 9/30* (2006.01)
  *G04G 17/08* (2006.01)
  *G06F 3/01* (2006.01)
  *G06F 3/0488* (2013.01)
  *A44C 5/02* (2006.01)
  *G04G 21/08* (2010.01)
  *A44C 5/00* (2006.01)
  *A44C 5/14* (2006.01)
  *G04G 17/04* (2006.01)
  *H05K 3/36* (2006.01)
  *H05K 3/46* (2006.01)
  *G06K 19/077* (2006.01)

(52) U.S. Cl.
  CPC .............. *G06F 1/163* (2013.01); *G06F 3/014* (2013.01); *G06F 3/0412* (2013.01); *G06F 3/04886* (2013.01); *G09F 9/301* (2013.01); *H04M 1/0268* (2013.01); *G06F 1/1626* (2013.01); *G06K 19/07703* (2013.01); *H05K 3/361* (2013.01); *H05K 3/4691* (2013.01)

(56) References Cited

U.S. PATENT DOCUMENTS

2015/0040611 A1* 2/2015 Olsen .................. A44C 5/2071
                                                                        63/3.1
2016/0349708 A1* 12/2016 Lee .................... G04B 37/1486

FOREIGN PATENT DOCUMENTS

| KR | 20-1999-0013434 U | 4/1999 |
| KR | 10-2016-0094053 A | 8/2016 |
| KR | 10-2016-0139733 A | 12/2016 |

\* cited by examiner (A)          (B)

(A)  (B)

(A)

(B)

(A)

(B)

(A)

(B)

190

(A)

(B)

(A)

(B)

(A)

(B)

(A)

(B)

(A)

(B)

(A)

(B)

RIGIDIFIABLE FLEXIBLE DEVICE

TECHNICAL FIELD

The present invention relates to a rigidifiable flexible device capable of, if necessary, bringing a flexible body, to which a flexible display or the like can be mounted, into a state in which the flexible body can be freely bent or a state in which the flexible body is rigidified in a straightened shape.

BACKGROUND

In recent years, a flexible display capable of being freely flexed or bent unlike an existing display draws attention. The flexible display is flexible because it is manufactured by using a substrate made of a flexible material such as plastic or the like instead of a glass substrate widely used in an existing display. Accordingly, the flexible display can be installed naturally even in a curved wall surface or the like and can be easily carried by wrapping or folding the same. Particularly, when the flexible display is applied to a wearable computer which has been widely spread in recent years, it is possible to more conveniently use the wearable computer due to the characteristics of the flexible display which can be freely deformed in conformity with the human body shape.

However, due to the flexibility thereof, the flexible display also has disadvantages as well as the above-mentioned advantages. One of the most problematic disadvantages is that unintentional deformation may occur even with a small external force. Accordingly, a user who tries to operate a touch screen type flexible display by touching the same with a finger may feel inconvenience as compared with a case of touching an existing hard display. Therefore, it may be necessary to suppress the bending of the flexible display in some cases.

FIG. 1 is a view for explaining a conventional technique for suppressing the flexibility of a flexible display. As shown in FIG. 1, the flexible display is supported by a hard frame 2 and, therefore, may have fixability. Although the method shown in FIG. 1 is easy to implement, the shape of the flexible display 1 is maintained only in conformity with the shape of the frame 2. Thus, the flexibility inherent in the flexible display 1 may be excessively limited. That is, according to the method shown in FIG. 1, the degree of freedom of deformation of the flexible display 1 is reduced. This may deteriorate the advantage of the flexible display 1 capable of taking a shape suitable for various situations.

SUMMARY

Embodiments of the present invention provide a flexible device such as a flexible display or the like capable of easily adjusting the bendability depending on the situation.

However, the problems to be solved by the present invention are not limited to the aforementioned one. A person having an ordinary knowledge in the field to which the present invention belongs will be able to clearly understand other problems from the following description.

In accordance with an embodiment of the present invention, there is provided a rigidifiable flexible device, including: a flexible member having flexibility; a plurality of movable members arranged in a line on a path between one end and the other end of the flexible member along a longitudinal direction of the flexible member, the movable members being movable on the path; a stopper provided at the one end of the flexible member and configured to prevent the movable members from being removed from the path beyond the one end of the flexible member; and a blocking member configured to prevent the movable members from being removed from the path beyond the other end of the flexible member, wherein the length of a portion of the path between the blocking member and the stopper is adjustable so that the movable members are brought into close contact with each other on the path to form an integrated support body.

Further, the flexible member may be a flexible wire, each of the movable members may have a through hole through which the wire extends, the movable members being movable along the wire, the stopper may be provided at the one end of the wire, the stopper having such a size that the stopper cannot pass through the through hole of each of the movable members, and the blocking member may have a passage through which the wire extends and may be configured to prevent the movable members from moving toward the other end of the wire through the passage.

The length of the wire may be longer than a length obtained by adding the length of the passage to the sum of the lengths of the through holes of the movable members.

A portion of the wire between the stopper and the blocking member may have a straight shape when the support body makes close contact with the stopper and the blocking member.

The flexible device may further include a position adjusting member provided at the other end of the wire to have such a size that the position adjusting member cannot pass through the passage.

The position adjusting member may be configured to adjust the length of a portion of the wire between the stopper and the blocking member by moving along a predetermined second path starting from the passage.

The position adjusting member may be fixed at a predetermined position on the second path to maintain a state in which the support body makes close contact with the stopper and the blocking member.

The flexible device may further include a pawl located at a predetermined position on the second path and configured to prevent the position adjusting member from moving through the predetermined position toward the passage on the second path and to allow the position adjusting member to move through the predetermined position away from the passage on the second path.

Each of the stopper, the blocking member and the movable members may have a concavo-convex shape so that the movable members can engage with each other, the blocking member can engage with one of the movable members adjacent to the blocking member, and the stopper can engage with one of the movable members adjacent to the stopper.

Further, the flexible device may further include a second wire having one end attached to the stopper; and a plurality of second movable members arranged in a line on the second wire and configured to be movable along the second wire, each of the second movable members having a through hole with such a diameter that the stopper cannot pass through the through hole, the second wire extending through the through hole, wherein the blocking member may have a second passage through which the second wire extends and is configured to prevent the second movable members from moving toward the other end of the second wire through the second passage.

The stopper may be attached to the blocking member.

The flexible device may further include a connecting member configured to connect adjacent movable members so that the gap between the adjacent movable members does not exceed a predetermined threshold gap.

The flexible device may further include a flexible body having one end attached to the blocking member and extending away from the blocking member to accommodate the wire, the movable members and the stopper therein.

The flexible device may further include a curvature adjustment portion attached to the blocking member and accommodated in the flexible body to extend in a longitudinal direction of the flexible body from the blocking member, the curvature adjustment portion configured to prevent the flexible body from being bent beyond a predetermined threshold curvature.

The curvature adjustment portion may include a plurality of unit members coupled to each other in a row, and an arc formed by connecting centers of the unit members is maintained so as not to exceed the predetermined threshold curvature.

The flexible body may include a rigid fixing member provided at the other end of the flexible body, and an elastic member accommodated in the flexible body and having one end attached to the fixing member and the other end attached to the stopper, and the elastic member, in a state in which the support body is making close contact with the stopper and the blocking member, may be configured to apply a restoring force acting in a direction toward the fixing member to the stopper.

The flexible body may include a rigid fixing member provided at the other end of the flexible body, and one or more rigid curvature preventing portions accommodated in the flexible body and configured to prevent the flexible body from being bent, each of the curvature preventing portions having one end attached to the fixing member and the other end attached to the stopper.

Each of the curvature preventing portions may include a plurality of rod-shaped frames coupled to each other in a row, and the adjacent frames may be coupled to each other by a joint passing through the adjacent frames to be rotatable about the joint.

The flexible device may further include a non-moving member fixed at a predetermined position in the flexible body and having a through hole through which the wire extends, the through hole having such a size that the movable members cannot pass through the through hole, and a second stopper fixed at a predetermined position on the wire between the blocking member and the non-moving member, the second stopper having such a size that the second stopper cannot pass through the through holes of the movable members and the through hole of the non-moving member, wherein some of the movable members are present between the blocking member and the second stopper on the wire, and the remaining movable members are present between the non-moving member and the stopper on the wire.

The through hole of the non-moving member may be formed in a semicircular shape so that both ends of the through hole face the blocking member.

The stopper may be fixed at an arbitrary position inside the flexible body, and the blocking member may be moved or extended toward the stopper so that the support body is brought into close contact with the blocking member and the stopper.

The flexible device may further include a flexible linear rail member mounted inside the flexible body and configured to guide movement of one of the movable members, the stopper and the blocking member.

A flexible display may be attached to an outer surface of the flexible body, and the flexible device may be configured to turn on the flexible display or to activate a predetermined function of the flexible device when the support body is brought into close contact with the stopper and the blocking member.

The distance between the stopper and the blocking member may be shorter than the length of the path in a state in which the support body is brought into close contact with the stopper and the blocking member.

The flexible member may be formed in a tube shape having an internal space, the internal space of the flexible member may be provided as a path through which the movable members is movable, and the blocking member may be configured to apply a pushing force acting in a direction toward the stopper to the movable members so that the movable members form the support body.

A through hole parallel to the path may be formed in each of the movable members.

The flexible device may have a wireless communication function, and the flexible device may be switched to a state in which a telephone conversation according to a call request can be made when the support body is brought into close contact with the stopper and the blocking member at the time of receiving the call request.

The flexible device may further include a main body provided with the blocking member; a voice output unit configured to output a voice transmitted to the flexible device through the telephone conversation; and a voice input unit configured to receive a voice to be transmitted to a communication terminal that has made the call request through the telephone conversation, wherein one of the voice output unit and the voice input unit is provided in the main body, and the other is provided in the flexible body.

According to an embodiment of the present invention, the bendability of the flexible device can be adjusted in an easy and simple manner by adjusting the degree of freedom of movement of the plurality of movable members that can move in the path provided by the flexible member. The flexible device according to an embodiment of the present invention has not only an advantage that the user can easily operate the flexible device, but also an advantage that the flexible device is structurally simple, easy to implement, and variously modifiable so as to satisfy different needs of a user.

The flexible device according to an embodiment of the present invention can be easily mounted on a curved portion such as a wrist of a person or the like due to its flexibility. If necessary, the flexible device can be utilized just like a conventional rigid device by suppressing the bending thereof. In addition, the flexible device according to an embodiment of the present invention may include a means for achieving an effect of uniformly suppressing the bending over the entire region of the flexible device, a means for preventing torsion of the flexible device in state in which the bending is suppressed, a means for limiting the bending degree of the flexible device to a certain level or less, and various other means. This makes it possible to provide various applications and convenience to the user.

In addition, the flexible display mounted on the flexible member of the flexible device according to an embodiment of the present invention can be operated differently depending on the bendability of the flexible member. Through these various additional functions, the user of the flexible device according to an embodiment of the present invention may enjoy enhanced convenience.

DETAILED DESCRIPTION

The advantages and features of exemplary embodiments of the present invention and methods of accomplishing them will be clearly understood from the following description of the embodiments taken in conjunction with the accompanying drawings. However, the present invention is not limited to those embodiments and is implemented in various forms. It is noted that the embodiments are provided to make a full invention and also to allow those skilled in the art to know the full scope of the present invention.

In the following description, well-known functions and/or configurations will not be described in detail if they would unnecessarily obscure the features of the invention. Further, the terms to be described below are defined in consideration of their functions in the embodiments of the present invention and vary depending on a user's or operator's intention or practice. Accordingly, the definition is made on a basis of the content throughout the present disclosure.

Figure 1:
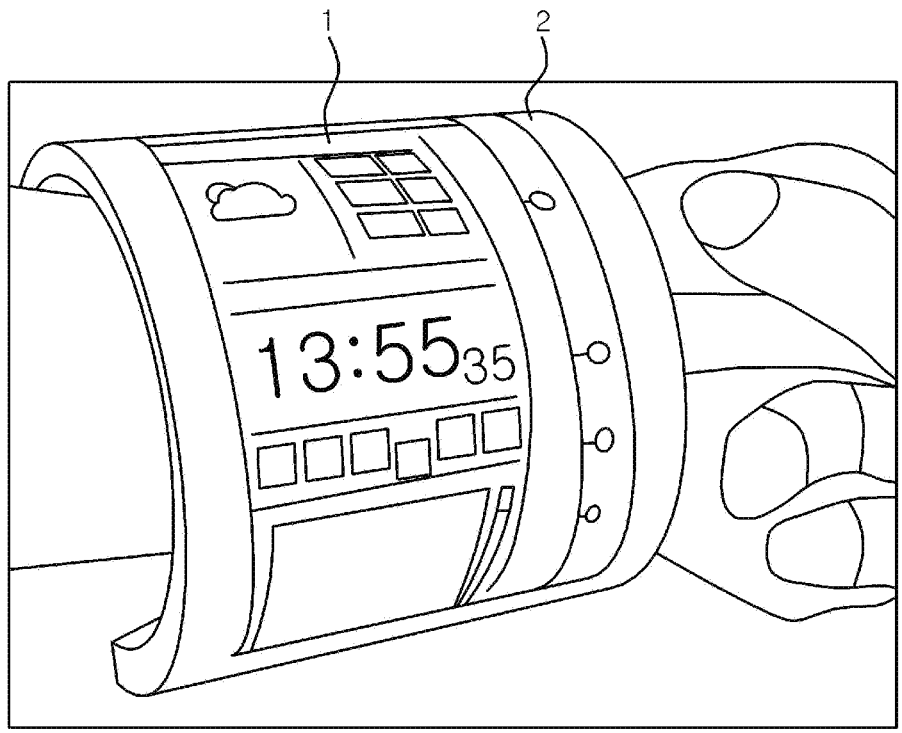
FIG. 1 is a view for explaining a conventional technique for suppressing the bending of a flexible display.
Figure 2A:
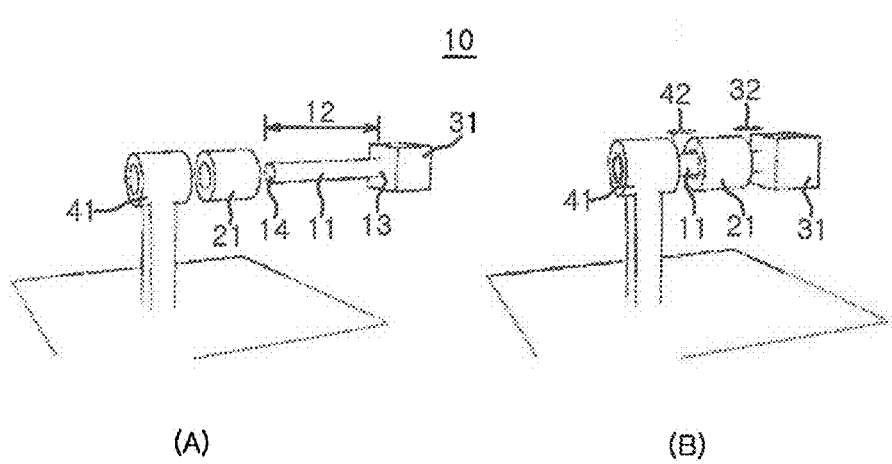
FIGS. 2A to 2C are views for explaining the basic concept of a flexible device according to an embodiment of the present invention.
Figure 2B:
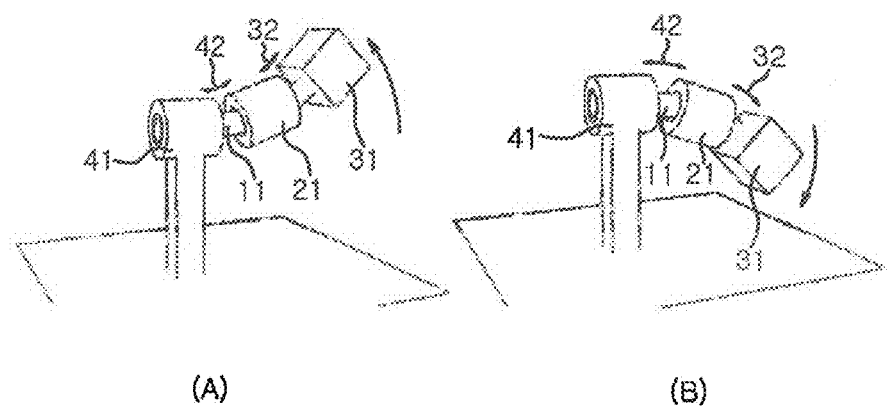
Figure 2C:
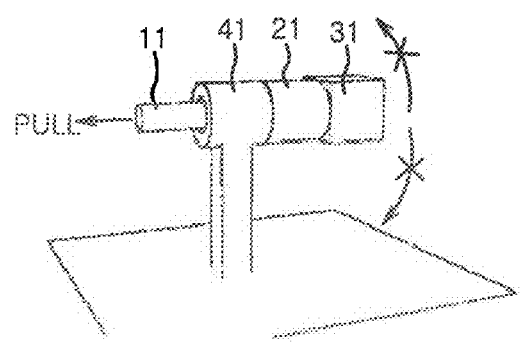

FIGS. 2A to 2C are views for explaining the basic concept of a flexible device according to an embodiment of the present invention. FIG. 2A is a view for describing components of a flexible device 10 according to an embodiment of the present invention. The flexible device 10 shown in FIG. 2A may include a flexible member 11, a plurality of movable members 21, a stopper 31 and a blocking member 41.

The flexible member 11 may extend in a predetermined direction to have an elongated shape like a rod. The flexible member 11 having such a shape may be made of a bendable material, for example, a metal wire, a synthetic resin, or the like. As a result, the flexible member 11 has flexibility and may be freely bent by an external force.

The movable member 21 may be a member which can freely move along a path 12 provided in the longitudinal direction of the flexible member 11. Such a movable member 21 is preferably made of a hard material which is not deformed by an external force, unlike the flexible member 11. The path 12 along which the movable member 21 can move is basically provided in a region between one end 13 and the other end 14 of the flexible member 11. Accordingly, the length of the path 12 cannot exceed the length of the flexible member 11. As illustrated in FIGS. 2A to 2C, the movable member 21 may be fitted onto the flexible member 11, whereby the movable member 21 can move along the longitudinal direction of the flexible member 11.

A plurality of movable members 21 may be present on the path 12. Since the path 12 is basically a one-dimensional path formed along the longitudinal direction of the flexible member 11, the respective movable members 21 are arranged in a line on the path 12 and may make one-dimensional movement on the path 12. It should be noted, however, that only one movable member 21 is shown in FIGS. 2A to 2C for the sake of convenience.

The stopper 31 is provided at one end 13 of the flexible member 11 to prevent the movable member 21 from deviating from the path 12 beyond the one end 13. The blocking member 41 may block the movable member 21 to prevent the movable member 21 from deviating from the path 12 beyond the other end 14 of the flexible member 11. That is, the stopper 31 and the blocking member 41 allow the movable member 21 to move only along the path 12 without departing from the path 12 defined by the flexible member 11. In order to smoothly perform the aforementioned function, the stopper 31 and the blocking member 41 may be made of a hard material just like the movable member 21. However, the present invention is not limited thereto.

As shown in FIGS. 2A to 2C, it is preferable that the stopper 31 is present in a state of being coupled to one end 13 of the flexible member 11. That is, the movement of the one end 13 of the flexible member 11 is dependent on the movement of the stopper 31, whereby the one end 13 may be present in a state of being stationary relative to the stopper 31. On the other hand, the blocking member 41 may exist without being coupled to the other end 14 of the flexible member 11. Thus, the movement of the other end 14 of the flexible member 11 is not dependent on the movement of the blocking member 41. For example, the other end 14 of the flexible member 11 may be freely moves even when the blocking member 41 is fixed.

Hereinafter, the basic operation principle of the flexible device 10 according to an embodiment of the present invention will be described with reference to FIGS. 2A to 2C. The flexible member 11, the movable member 21, the stopper 31 and the blocking member 41 shown in (A) of FIG. 2A may have the positional relationship as shown in (B) of FIG. 2A. In the state shown in (B) of FIG. 2A, the movable member 21 may be present between the stopper 31 and the blocking member 41. When a space 32 exists between the movable member 21 and the stopper 31 or when a space 42 exists between the movable member 21 and the blocking member 41, the movable member 21 may freely move between the stopper 31 and the blocking member 41 along the path 12 formed in the longitudinal direction of the flexible member 11.

In the state shown in (B) of FIG. 2A, the flexible member 11 may be bent in a direction deviating from the longitudinal direction as shown in (A) or (B) of FIG. 2B. More precisely, the flexible member 11 may be bent in the portions of the flexible member 11 where the spaces 32 and 42 are formed, not in the portion of the flexible member 11 occupied by the movable member 21. On the other hand, as shown in FIG. 2C, when the movable member 21 is immovably positioned between the stopper 31 and the blocking member 41 as the distance between the stopper 31 and the blocking member 41 decreases, the spaces 32 and 34 shown in FIG. 2B are removed. Thus, portion between the stopper 31 and the blocking member 41 in the flexible member 11 cannot be bent.

It can be seen from the foregoing description that the bending of the flexible member 11 may or may not be made possible by adjusting the distance between the stopper 31 and the blocking member 41. If the flexible display is attached to the surface of a flexible outer casing which accommodates the flexible member 11, the plurality of movable members 21, the stopper 31 and the blocking member 41 using such a principle, it is possible to conveniently control the bending or non-bending of the flexible display depending on the situation.

FIGS. 3A to 3D are views for explaining an exemplary implementation form of a flexible device according to an embodiment of the present invention. In FIGS. 3A to 3D, it is assumed that the flexible device 100 is implemented in the form of a smart watch that can be worn on the wrist of a person among wearable computers. However, this is nothing more than an example presented for the convenience of description. The spirit of the present invention is not narrowly construed by FIGS. 3A to 3D.

Figure 3A:
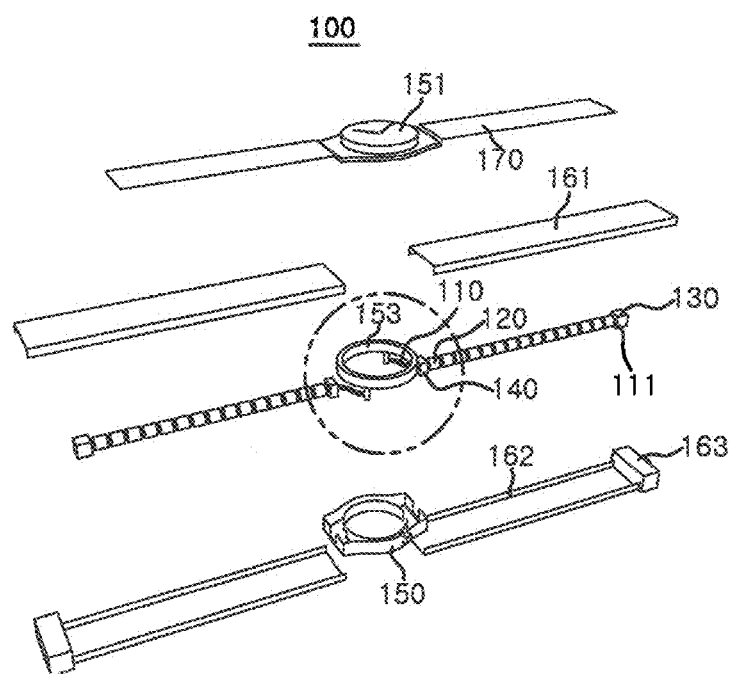
FIGS. 3A to 3D are views for explaining an exemplary implementation form of a flexible device according to an embodiment of the present invention.

The flexible device 100 of FIGS. 3A to 3D complies with the basic concept of the present invention described with reference to FIGS. 2A to 2C and, therefore, may include a wire 110 as a flexible member, a movable member 120, a stopper 130 and a blocking member 140. FIG. 3A is a view for explaining the detailed configuration of the flexible device 100, and FIG. 3B is an enlarged view showing the part indicated by a two-dot chain line circle in FIG. 3A.

Figure 3B:
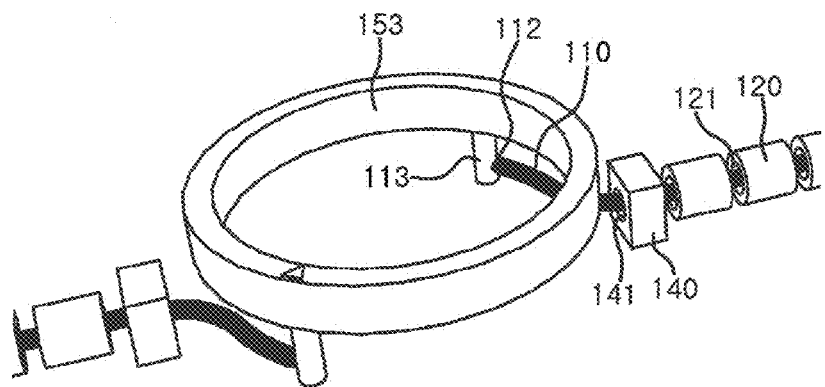

As shown in FIGS. 3A and 3B, a through hole 121 may be formed in each movable member 120, and the through hole 121 of each movable member 120 may be penetrated by the wire 110. Accordingly, the respective movable members 120 may be arranged in a line on the wire 110. If it is assumed that both the wire 110 and the through hole 121 are formed in a cylindrical shape, the diameter of the through hole 121 may be set to be larger than the diameter of the wire 110. In this case, each movable member 120 can move freely on the wire 110 along the longitudinal direction of the wire 110, but cannot move past the adjacent movable member 120.

The stopper 130 provided at one end 111 of the wire 110 is fixed to one end 111 of the wire 110, thereby preventing the movable member 120 from being detached from the wire 110 beyond one end 111 of the wire 110. To this end, the stopper 130 may have such a size that the stopper 130 cannot pass through the through hole 121 of the movable member 120.

The blocking member 140 may prevent the movable member 120 from being detached from the wire 110 beyond the other end 112 of the wire 110. That is, the stopper 130 and the blocking member 140 may perform similar functions at one end 111 and the other end 112 of the wire 110. The stopper 130 and the blocking member 140 having similarity in terms of their function may be structurally different from each other. Unlike the stopper 130, the blocking member 140 may be present in a state in which the blocking member 140 is not attached to the other end 112 of the wire 110. A passage 141 through which the other end 112 of the wire 110 can freely pass may be formed in the blocking member 140. The passage 141 may be formed at such a size such that the passage 141 allows the wire 110 to pass therethrough but does not allow the movable member 120 to pass through. Thus, the blocking member 140 can prevent the movable member 120 from being detached from the wire 110.

The blocking member 140 may be formed in a polyhedral shape fixed at a predetermined position of the main body 150. However, the present invention is not limited thereto. The blocking member 140 may be mounted and fixed to the main body 150 of the flexible device 100 to be described later. The passage 141 may be formed at a predetermined position of the blocking member 140 in the form of a through hole. When the blocking member 140 is formed in a polyhedral shape, the entrance and the exit of the passage 141 may be formed on opposite surfaces of the blocking member 40.

At the other end 112 of the wire 110, a position adjusting member 113 may be provided. The position adjusting member 113 may prevent the other end 112 of the wire 110 from moving through the passage 141 of the blocking member 140. This makes it possible to prevent the wire 110 from being detached from the blocking member 140.

The position adjusting member 113 may be coupled to an operating member 153. The user of the flexible device 100 may move the position adjusting member 113 by operating the operating member 153. In this manner, the user may pull the wire 110 so that the other end 112 of the wire 110 is moved away from the blocking member 140. Details of the operating member 153 and the position adjusting member 113 will be described later with reference to FIGS. 5A to 5C.

It can be seen that the operating member 153 is formed in the form of a circular ring so that the operating member 153 can be easily mounted on the main body 150 of the flexible device 100. Needless to say, the shape of the operating member 153 shown in FIG. 3A is nothing more than an example. The operating member 153 may be implemented in the form of a polygonal ring rather than a circular ring. Furthermore, the operating member 153 may also be implemented in a shape other than the ring shape, which is suitable for moving the position adjusting member 113.

Next, the overall structure of the flexible device 100 will be described. The flexible device 100 may further include a main body 150, a fixing member 163 and a lower body 162. Assuming that the flexible device 100 is implemented in the form of a smart watch as described above, the main body 150 may be a hard part which is positioned in the portion of the user's wrist adjacent to the back of the user's hand and which becomes a user's main operation target.

The lower body 162 may be formed of a flexible material such as leather or the like to have an elongated shape. The main body 150 may be coupled to one end of the lower body 162, and the fixing member 163 may be coupled to the other end of the lower body 162. The fixing member 163 is preferably formed of a hard materials. However, the present invention is not limited thereto. As shown in FIG. 3A, the lower body 162 and the fixing member 163 may be provided on both sides of the main body 150.

The blocking member 140 and the operating member 153 may be mounted on the main body 150 in a state in which the main body 150, the fixing member 163 and the lower body 162 are coupled to each other as described above. The wire 110, the movable members 120 through which the wire 110 extends, and the stopper 130 coupled to one end 111 of the wire 110 may be placed on the lower body 162. At this time, a part of the wire 110 may be allowed to pass through the passage 141 of the blocking member 140 so that the movable member 120 and the stopper 130 are disposed on one side of the passage 141 while the other end 112 of the wire 110 is positioned on the other side of the passage 141.

On the other hand, a structure (hereinafter referred to as "flexible frame" for the sake of convenience) composed of the wire 110, the movable members 120 and the stopper 130 may be provided for each lower body 162 as shown in FIG. 3A. Thus, the blocking member 140 and the passage 141 may also be provided for each flexible frame.

An upper body 161 made of the same material as the lower body 162 may cover the lower body 162 in a state in which the flexible frame is placed on the lower body 162 as described above. Needless to say, one upper body 161 may be provided for each lower body 162. One end of each upper body 161 may be coupled to the main body 150, and the other end of each upper body 161 may be coupled to the fixing member 163. Accordingly, the upper body 161 and the lower body 162 may form a single body 160 having a space for accommodating the flexible frame therein as shown in FIG. 3C.

Figure 3C:
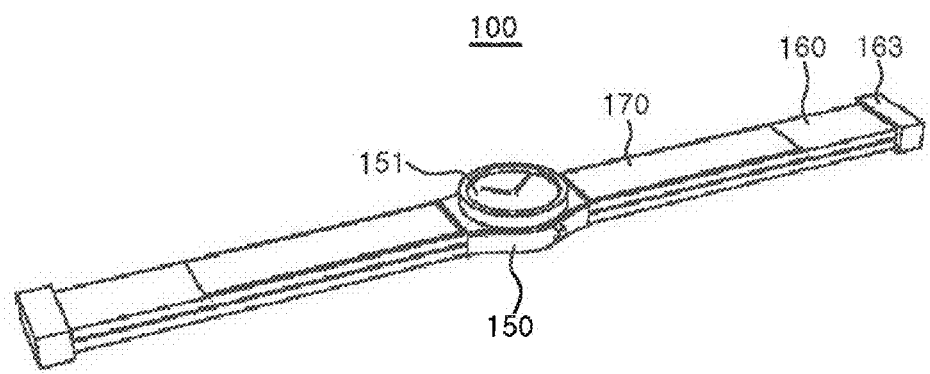

As shown in FIG. 3C, the assembled flexible device 100 may be configured so that only the main body 150, the flat display 151 provided on the front surface of the main body 150, the body 160 and the fixing member 163 are exposed to the outside. Accordingly, the wire 110, the movable members 120, the stopper 130 and the blocking member 140 are present inside the main body 150 or the body 160 and may not be visible from the outside. The operating member 153 may be partially or entirely exposed to the outside so that the user of the flexible device 100 can manually operate the operating member 153. However, when the operating member 153 is automatically operated through a small motor (not shown), the operating member 153 may be arranged so as not to be exposed to the outside. The flexible device 100 shown in FIG. 3C has the form of a typical wristwatch or a smart watch and, therefore, may be worn on the wrist of a user.

A flexible display 170 may be additionally attached to the surface of the body 160, more precisely the surface of the upper body 161 which is exposed to the outside when the user wears the flexible device 100 on the wrist. The flexible display 170 may be used for supplementing the flat display 151 provided in the main body 150. When the main body 150 is not provided with the flat display 151, the flexible display 170 may serve as a main display. Exemplary operations that can be performed by the flexible display 170 in conjunction with other components of the flexible device 100 will be described later. The flexible display 170 may be implemented in a variety of ways from a functional or structural viewpoint. For example, the flexible display 170 may have a touch input function. In addition, the flexible display 170 may be implemented as a flexible touch film on which a specific menu is printed.

Figure 3D:
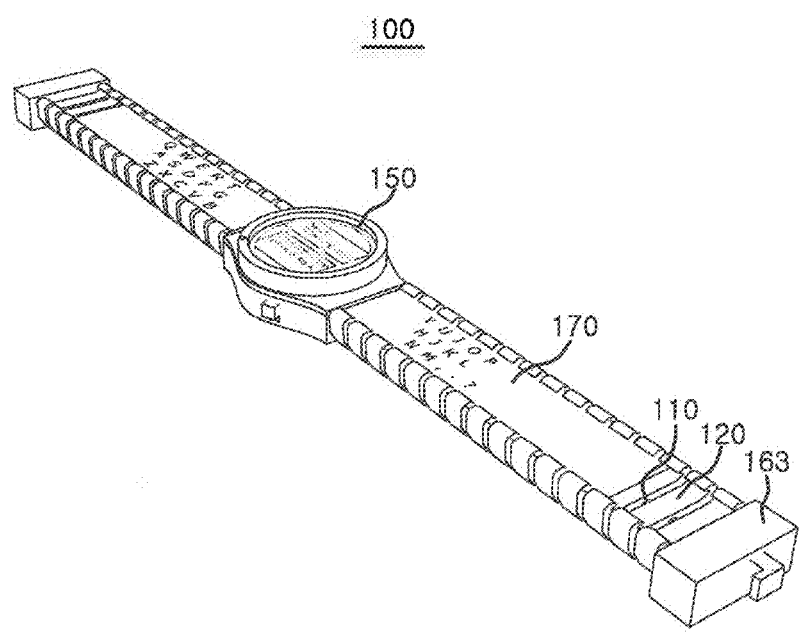

Unlike the embodiment of FIGS. 3A to 3C, as shown in FIG. 3D, it is possible to implement the flexible device 100 which does not include the body 160 shown in FIG. 3C. In this case, components such as the wire 110 and the movable members 120 may be exposed to the outside. Unlike FIG. 3C, according to FIG. 3D, the stopper 130 may be integrated with the fixing member 163. In addition, the movable members 120 may have a structure capable of supporting the flexible display 170 as shown in FIG. 3D.

The flexible display 170 shown in FIGS. 3A and 3C is mounted on the flexible body 160 and, therefore, can be bent together with the body 160. However, the bending of the flexible display 170 may be suppressed depending on the actions of the wire 110, the movable members 120, the stopper 130 and the blocking member 140 included in the flexible device 100. The principle of controlling the bendability has been described above with reference to FIGS. 2A to 2C. Hereinafter, the principle of controlling the bendability will be described in more detail with reference to FIGS. 4A and 4B.

Figure 4A:
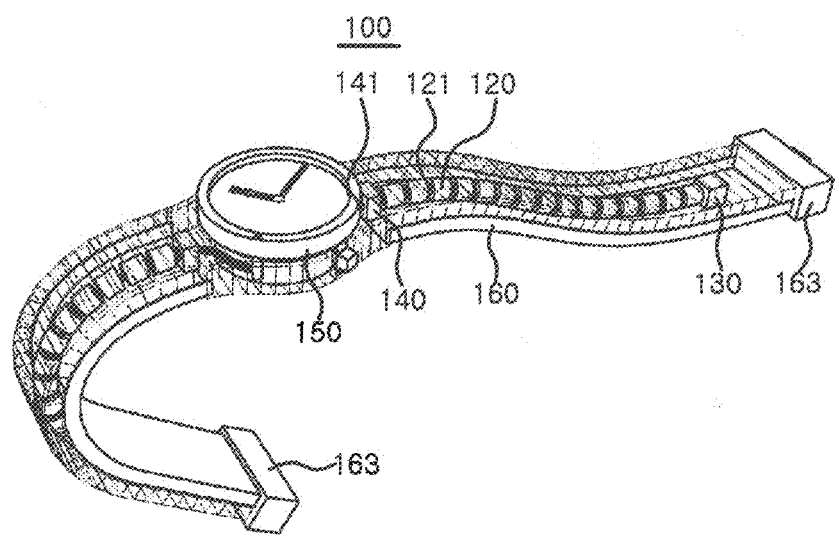
FIGS. 4A and 4B are views for explaining the adjustment of the bendability of a flexible device according to an embodiment of the present invention.
Figure 4B:
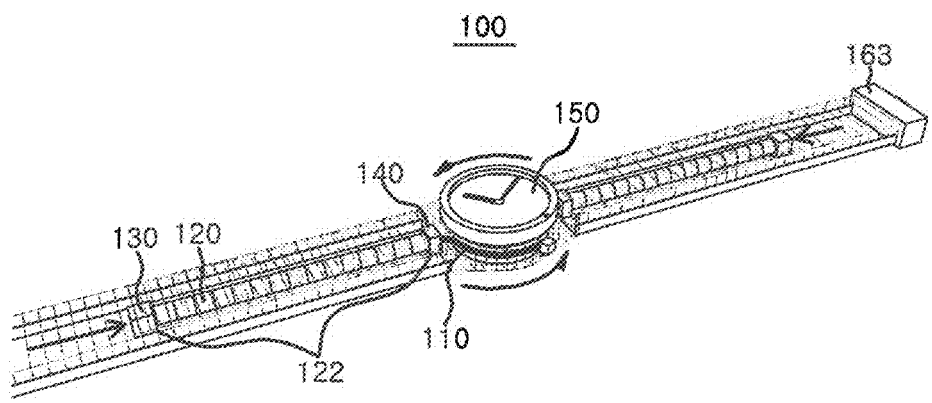

FIGS. 4A and 4B are views for explaining the adjustment of the bendability of the flexible device according to the embodiment of the present invention. In the flexible device 100 shown in FIG. 4A, the distance between the stopper 130 and the blocking member 140 is longer than the sum of the lengths of the through holes 121 of the respective movable members 120. Thus, a space exists between the adjacent movable members 120, and the wire 110 is bendable and the body 160 configured to accommodate the wire 110 therein and the flexible display 170 mounted on the surface of the body 160 are also flexible. Thus, the body 160 and the flexible display 170 may be bent in a direction deviating from the longitudinal direction of the body 160. In order to realize the aforementioned state, it is required for the wire 110 to have a length longer than the length obtained by adding the length of the passage 141 formed in the blocking member 140 to the sum of the lengths of the through holes 121 of the respective movable members 120.

At this time, if the wire 110 is pulled toward the main body 150, the space between the adjacent movable members 120 gradually decreases. When the distance between the stopper 130 and the blocking member 140 becomes close to the sum of the lengths of the through holes 121 of the respective movable members 120, the space between the adjacent movable members 120 disappears. Accordingly, as shown in FIG. 4B, each of the movable members 120 may make close contact with the adjacent movable member 120 to form an integrated support body 122. When the wire 110 is kept in a pulled state, one end of the support body 122 is maintained in close contact with the stopper 130 and the other end of the support body 122 is maintained in close contact with the blocking member 140. Thus, the portion between the stopper 130 and the blocking member 140 in the wire 110 is maintained in a linear shape and cannot be bent. Accordingly, the body 160 and the flexible display 170 may be maintained in an unbendable state.

In summary, the bendability of the flexible display 170 may be adjusted by a simple method of pulling or loosening the wire 110 to adjust the distance between the stopper 130 and the blocking member 140. This method is advantageous in that it is convenient to operate, structurally simple and easy to implement.

Figure 5A:
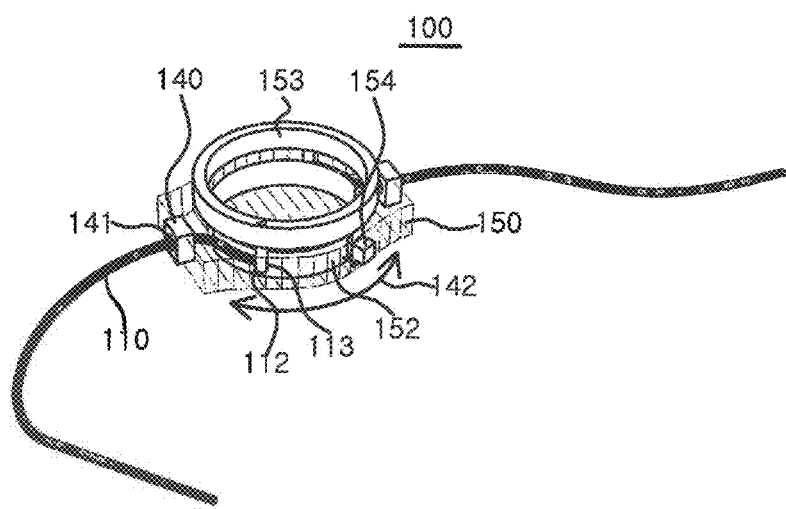
FIGS. 5A to 5C are views for explaining a structure for performing a function of pulling or loosening a wire in a flexible device according to an embodiment of the present invention.
Figure 5B:
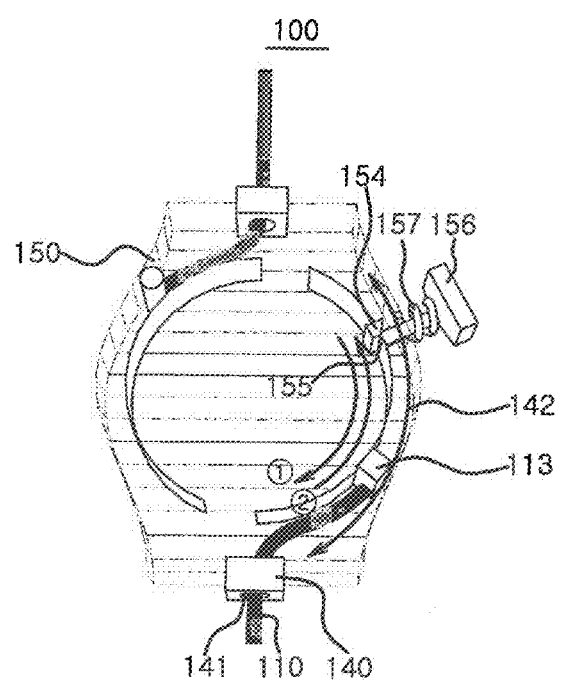
Figure 5C:
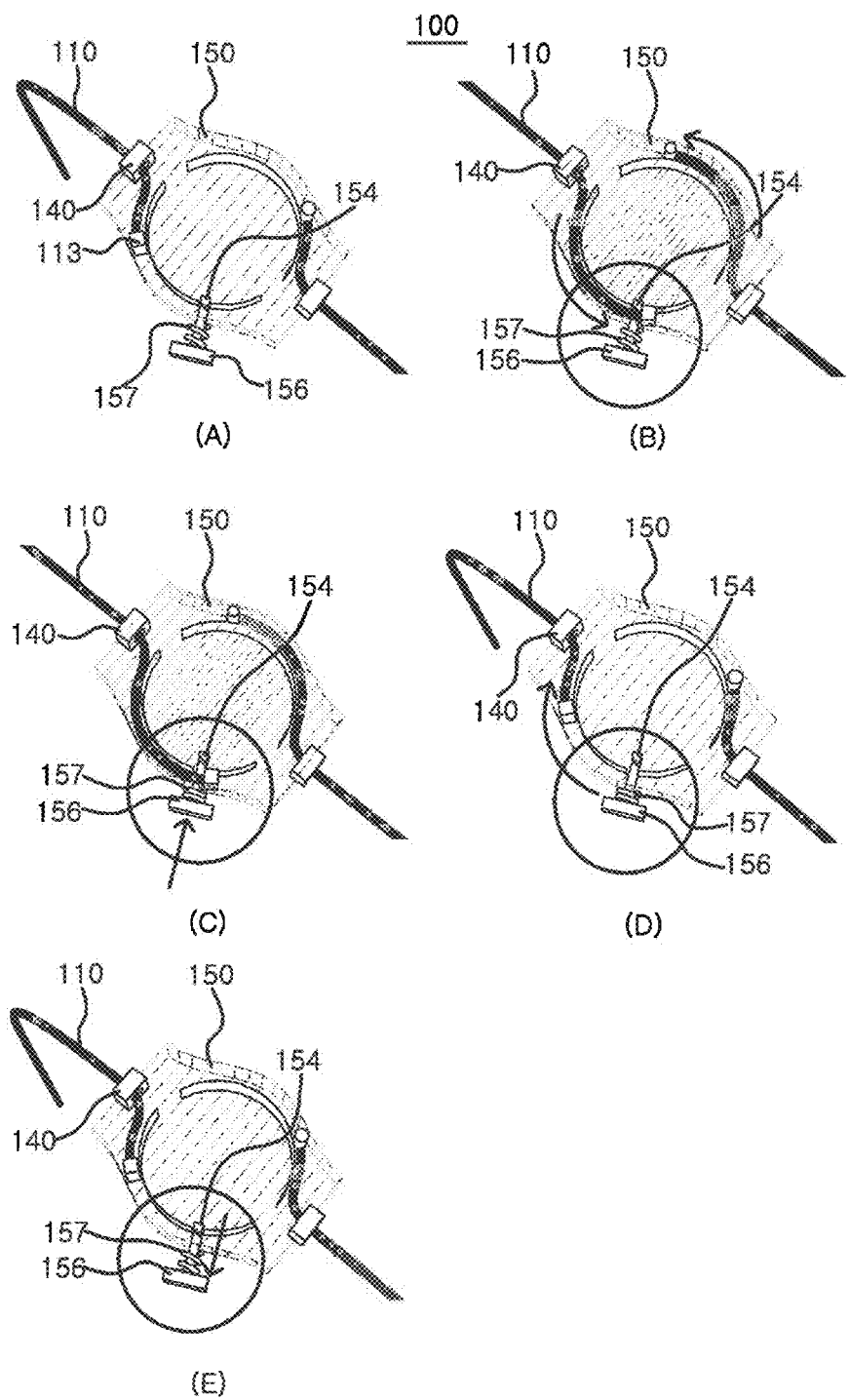

FIGS. 5A to 5C are views for explaining a structure for performing a function of pulling or loosening the wire in the flexible device according to the embodiment of the present invention. As can be seen in FIG. 5A, the position adjusting member 113 may be fixedly coupled to the other end 112 of the wire 110. Accordingly, by pulling the position adjusting member 113 away from the blocking member 140, it is possible to pull the wire 110 toward the main body 150. In addition, the position adjusting member 113 may have such a size that the position adjusting member 113 cannot pass through the passage 141 of the blocking member 140. Thus, by preventing the other end 112 of the wire 110 from moving to the space inside the body 160 through the passage 141, it is possible to prevent the movable members 120 from being detached from the wire 110 beyond the other end 112 of the wire 110.

The position adjusting member 113 may move along a predetermined second path 142 starting from the passage 141 of the blocking member 140. According to the flexible device 100 shown in FIG. 5A, the second path 142 is preferably provided in the main body 150. Referring to FIG. 5A, the movement of the position adjusting member 113 may be guided by a guide 152 provided in the main body 150 and having an arc shape. In this case, the second path 142 may be a path that makes contact with the outer wall of the guide 152.

As shown in FIG. 5A, the flexible device 100 may further include an operating member 153 for moving the position adjusting member 113 on the second path 142. The operating member 153 may be formed in a circular ring shape so that the position adjusting member 113 can move in the second path 142 having an arc shape corresponding to the shape of the guide 152. As can be seen in FIG. 5A, the position adjusting member 113 may be attached to the operating member 153. Thus, by the rotational movement of the operating member 153 on the second path 142, the position adjusting member 113 may also move on the second path 142.

The operating member 153 may be partially or entirely exposed to the outside of the main body 150. The user of the flexible device 100 may adjust the pulling degree of the wire 110 by rotating the operating member 153 using the exposed portion thereof. This makes it possible to adjust the bendability of the body 160 and the flexible display 170.

It may be required that the state in which the bending of the body 160 and the flexible display 170 is suppressed is maintained by pulling the wire 110 toward the main body 150 at the maximum. To this end, the flexible device 100 may further include a pawl 154. The pawl 154 may fix the position adjusting member 113 at a position on the second path 142 where the other end 112 of the wire 110 is placed with the wire 110 pulled toward the main body 150 at the maximum.

Referring to FIG. 5B, it can be seen that the pawl 154 is located at a predetermined position on the second path 142. The pawl 154 may prevent the position adjusting member 113 from going past the pawl 154 through the movement toward the passage 141 of the blocking member 140 on the second path 142, but may allow the position adjusting member 113 to pass through the pawl 154 through the movement away from the passage 141 on the second passage 142. That is, the position adjusting member 113 cannot go past the pawl 154 through the movement in the direction of arrow ① in FIG. 5B but can go past the pawl 154 through the movement in the direction of arrow ②.

In order to perform the aforementioned function, the surface (hereinafter referred to as "first surface") of the polygonal pawl 154 that makes contact with the position adjusting member 113 moving in the direction of arrow ① may be formed to be perpendicular to the moving direction of the position adjusting member 113 at the moment when the position adjusting member 113 reaches it. On the other hand, the surface (hereinafter referred to as "second surface") of the polygonal pawl 154 that makes contact with the position adjusting member 113 moving in the direction of arrow ② may be obliquely formed so as not to be perpendicular to the moving direction of the position adjusting member 113 at the moment when the position adjusting member 113 reaches it. Specifically, the inclination of the second surface may be formed so that the distance between the first surface and the second surface becomes smaller away from the center of the main body 150.

A pawl passage 155 having such a size that the pawl 154 can pass through the pawl passage 155 may be formed in a portion of the guide 152 near the position where the pawl 154 is installed as described above. At this time, the pawl 154 may be positioned across the pawl passage 155. Then, when the position adjusting member 113 moving in the direction of arrow ② reaches the pawl 154, the position adjusting member 113 continues to move in the direction of arrow ② while pushing the inclined second surface of the pawl 154. As a result, the pawl 154 is moved toward the center of the main body 150 through the pawl passage 155, and the position adjusting member 113 can pass through the position of the pawl 154.

On the other hand, when the position adjusting member 113 moving in the direction of arrow ① reaches the pawl 154, the pawl 154 is not moved toward the center of the main body 150 and is not moved in the moving direction of the position adjusting member 113 due to the guide 152. This is because unlike the second surface, the first surface is perpendicular to the moving direction of the position adjusting member 113. Therefore, the position adjusting member 113 cannot pass through the position of the pawl 154.

Meanwhile, the flexible device 100 may further include a push button 156 and an elastic body 157 for operation of the pawl 154. One end of the push button 156 may make contact with the pawl 154 within a range that does not disturb the movement of the position adjusting member 113, and the other end of the push button 156 may be exposed to the outside of the main body 150 so that the push button 156 can be operated by the user of the flexible device 100. Therefore, a hole through which the push button 156 extends may be formed in the outer wall of the main body 150.

One end of the elastic body 157 may be connected to the one end of the push button 156, and the other end of the elastic body 157 may be connected to the outer wall of the main body 150. For example, the elastic body 157 may be provided in the form of a spring that surrounds the portion of the push button 156 exposed to the outside the main body 150. Even if the push button 156 is pushed by the user toward the center of the main body 150, upon releasing the pressing force applied by the user, the push button 156 will return to its original position together with the pawl 154 by the restoring force of the elastic body 157.

Hereinafter, a method of allowing or suppressing the bending of the flexible display 170 using the operating member 153 and the push button 156 will be described with reference to FIG. 5C. The flexible device 100 in (A) of FIG. 5C is in a state in which the flexible display 170 can be bent because the wire 110 is not sufficiently pulled toward the main body 150.

At this time, the operating member 153 may be operated so that as shown in (B) of FIG. 5C, the position adjusting member 113 can go past the position of the pawl 154. When the position adjusting member 113 goes past the aforementioned position, the pawl 154, which has been pushed toward the center of the main body 150, may return to its original position by the restoring force of the elastic body 157. The returned pawl 154 may prevent the position adjusting member 113 moving in the direction of arrow ① in FIG. 5B from going past the position where the pawl 154 exists. As a result, the wire 110 may be pulled up toward the main body 150 as much as possible. As a result, the flexible display 170 may be naturally maintained in an unbendable state.

If the user desires to make the flexible display 170 bendable again, the user may press the push button 156 to move the pawl 154 toward the center of the main body 150 as shown in (C) of FIG. 5C. Then, the position adjusting member 113, which has been kept against movement in the direction of arrow ① by the pawl 154, can move toward the blocking member 140 past the position of the pawl 154 as shown in (D) of FIG. 5C. As a result, a space is formed between the movable members 120 through which the wire 110 extends, resulting in a state in which the flexible display 170 can be bent. On the other hand, when the user releases the pressing force applied to the push button 156, the push button 156 may return to its original position by the restoring force of the elastic body 157 as shown in (E) of FIG. 5C.

The operation of mechanically pulling or loosening the wire 110 by using the operating member 153 and the pawl 154 has been described above with reference to FIGS. 5A to 5C. However, the method of pulling or loosening the wire 110 is not limited to the one described above. For example, instead of directly turning the operating member 153 by, e.g., his fingers, the user may pull or loosen the wire 110 by operating a small motor (not shown) installed in the main body 150. At this time, the user may control the operation of the motor by operating an operation button (not shown) provided on the main body 150 or a menu displayed on the flat display 151.

Figure 6A:
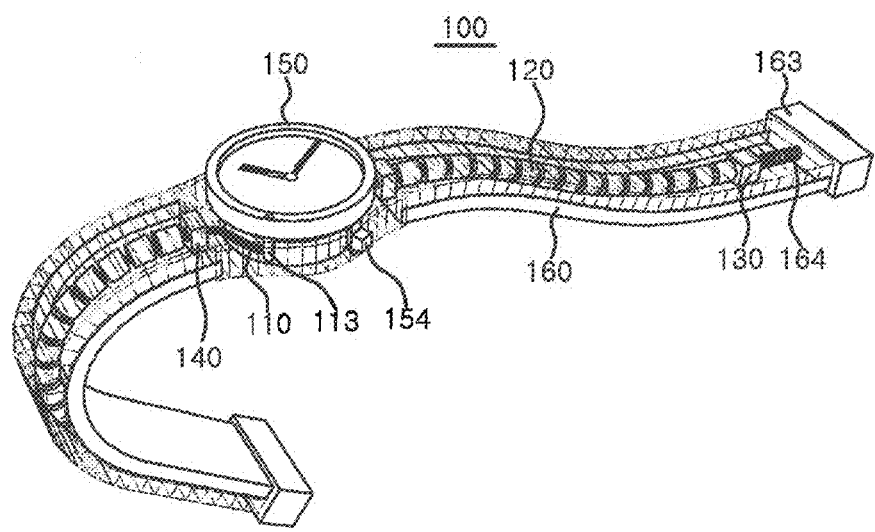
FIGS. 6A and 6B are views for explaining an embodiment in which a flexible device according to an embodiment of the present invention is restored from a straightened state to an original state.
Figure 6B:
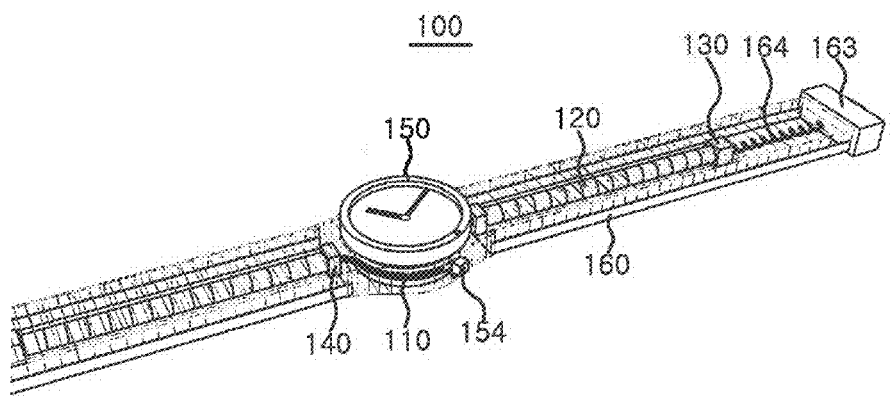

FIGS. 6A and 6B are views for explaining an embodiment in which a flexible device according to an embodiment of the present invention is restored from a straightened state to an original state. As described with reference to FIGS. 5A to 5C, the flexible display 170 may be made unbendable by pulling the wire 110 toward the main body 150 as much as possible using the operating member 153 and then fixing the position adjusting member 113 using the pawl 154. At this time, when the user wishes to release the maximum pulled state of the wire 110 in order to allow the flexible display 170 to be bent again, the user may press the push button 156 so that the pawl 154 is deviated from the second path 142. Thereafter, the user may move the position adjusting member 113 toward the passage 141 of the blocking member 140 using the operating member 153.

However, the act of operating the operating member 153 may also be troublesome to the user. Even if the position adjusting member 113 is moved until the position adjusting member 113 comes into close contact with the blocking member 140, the wire 110 is not necessarily returned to the state before the wire 110 is pulled. This is because the force of pushing the wire 110 at the other end 112 of the wire 110 may not be transmitted to one end 111 of the wire 110 due to the flexibility of the wire 110.

In order to solve the aforementioned problem, as shown in FIG. 6A, the body 160 may further include an elastic member 164, one end of which is connected to the fixing member 163 of the body 160 and the other end of which is connected to the stopper 130. As shown in FIG. 6A, when an external force is not applied to the elastic member 164 so that the elastic member 164 has the original length, the body 160 and the flexible display 170 may be freely bent.

When the wire 110 is pulled toward the main body 150, the distance between the stopper 130 and the fixing member 163 increases. Accordingly, the length of the elastic member 164 also increases, and a force acting in a direction toward the fixing member 163 is applied to the stopper 130 by the restoring force of the elastic member 164. The force applied to the stopper 130 may be maximized when the wire 110, the body 160, and the flexible display 170 are straightened as the wire 110 is pulled to the maximum extent toward the main body 150 as shown in FIG. 6B. However, as the position adjusting member 113 is fixed by the pawl 154, the stopper 130 does not actually move toward the fixing member 163.

However, when the push button 156 is pressed to allow the flexible display 170 to be bent again, the pawl 154 does not restrict the movement of the position adjusting member 113. Thus, the stopper 130 which cannot move due to the fixing of the position adjusting member 113 is also automatically moved toward the fixing member 163 by the restoring force of the elastic member 164. As a result, the flexible device 100 returns to the state shown in FIG. 6A again.

According to the embodiment of FIGS. 6A and 6B using the elastic member 164 as described above, the flexible device 100 may be conveniently returned to the original bendable state by merely pressing the push button 156 in the state where the wire 110 is pulled at the maximum.

Figure 7A:
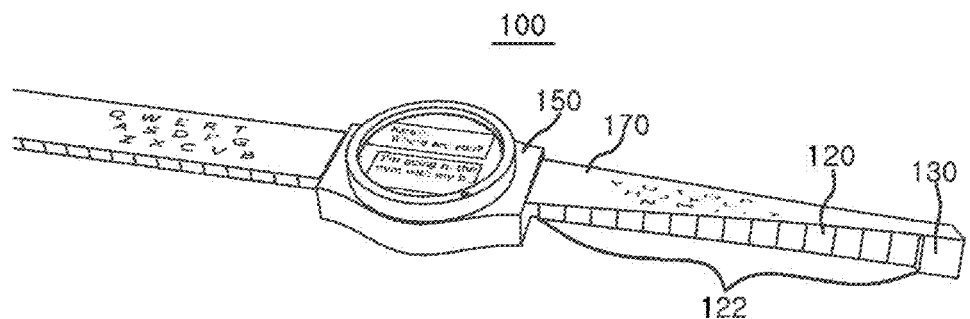
FIGS. 7A to 7D are views for explaining an embodiment in which distortion of a flexible device according to an embodiment of the present invention is prevented.

Hereinafter, various additional embodiments for enhancing the use convenience of the flexible device 100 will be described. FIGS. 7A to 7D are views for explaining an embodiment in which the distortion of a flexible device according to an embodiment of the present invention is prevented. Even when the wire 110 is pulled toward the main body 150 as much as possible so that the flexible display 170 cannot be bent, if a torque acting about the wire 110 is applied to the support body 122 formed of the movable members 120 remaining in close contact with each other, distortion may occur in the support body 122 as shown in FIG. 7A. Such distortion of the support body 122 may cause distortion of the flexible display 170. Thus, it may be required to take a measure for preventing the support body 122 from being distorted.

Figure 7B:
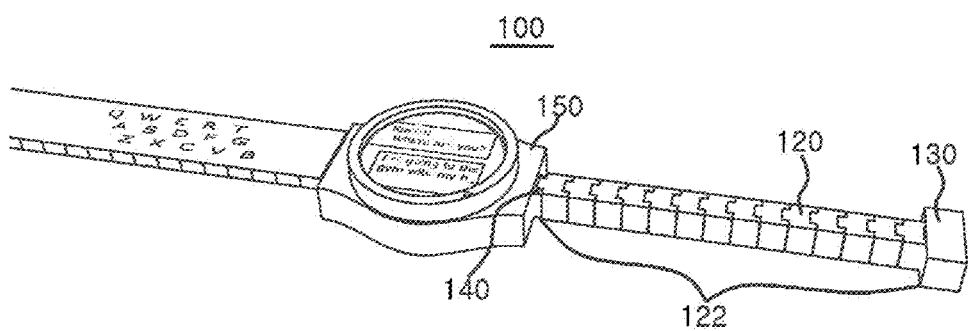

Hereinafter, an example of the above measure will be described with reference to FIGS. 7B to 7D. First, as shown in FIG. 7B, a method of providing unevenness to each of the movable members 120 may be taken into account. In this case, a convex portion may be formed in one of the two adjacent movable members 120, and a concave portion may be formed in the other of the two adjacent movable members 120. The blocking member 140 may also have a concave portion so that the concave portion of the blocking member 140 can be coupled to the convex portion of the movable member 120 adjacent to the blocking member 140. Of course, a convex portion may be added to the blocking member 140 so that the convex portion of the blocking member 140 can be coupled to the concave portion of the movable member 120 adjacent to the blocking member 140. Furthermore, a concave portion or a convex portion may be added to the stopper 130 to engage with the movable member 120 adjacent to the stopper 130. According to the embodiment of FIG. 7B, the movable members 120, the stopper 130 and the blocking member 140 are engaged with each other through the concave and convex portions. As a result, it is possible to prevent the distortion of the flexible display 170.

Figure 7C:
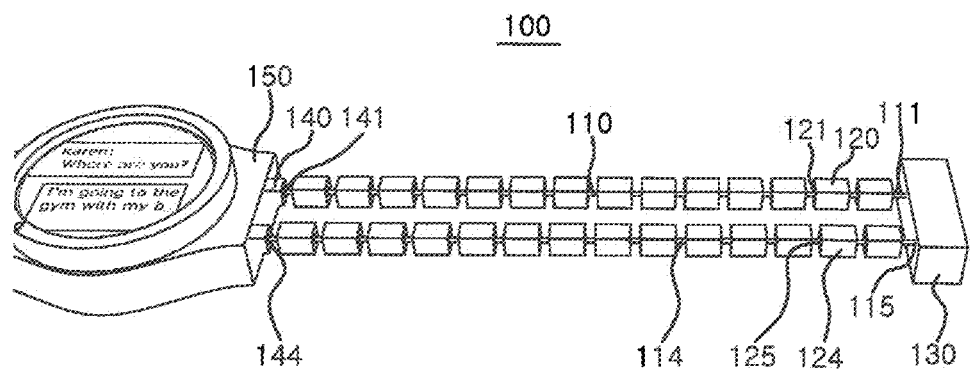

Next, as shown in FIG. 7C, it is conceivable to use a method in which two or more structures each composed of a wire 110 and a plurality of movable members 120 threaded by the wire 110 are arranged in parallel with each other. Referring to FIG. 7C, it can be seen that, in addition to the wire 110, a flexible second wire 114 is additionally connected to the stopper 130. The blocking member 140 may further have a second passage 144 through which the second wire 114 passes. A plurality of second movable members 124 having through holes 125 whose diameter is set such that the stopper 130 cannot pass through the through holes 125 may be arranged in a line between the stopper 130 and the blocking member 140 with the second wire 114 extending through the through holes 125. Each of the second movable members 124 may freely move along the second wire 114. The second wire 114 and the second movable members 124 may be made of the same material and may be formed in the same shape as the wire 110 and the movable members 120, respectively.

The second movable member 124 cannot be separated from the second wire 114 beyond one end 115 of the second wire 114 because the stopper 130 has such a size that the stopper 130 cannot pass through the through holes 125 of the second movable members 124. Furthermore, since the second movable members 124 have such a size that they cannot pass through the second passage 144, the second movable members 124 cannot be separated from the second wire 114 beyond the other end (not shown) of the second wire 114.

In order to prevent the flexible display 170 from being bent in the above-described state, the user may maintain a state in which the wire 110 and the second wire 114 are pulled toward the main body 150 as much as possible. Then, the movable members 120 may form an integrated support body 122. At the same time, the second movable members 124 may form an integrated support body (not shown). In other words, two elongated support bodies having the same shape are formed so that they can be more resistant to distortion than when only one support body is present.

Figure 7D:
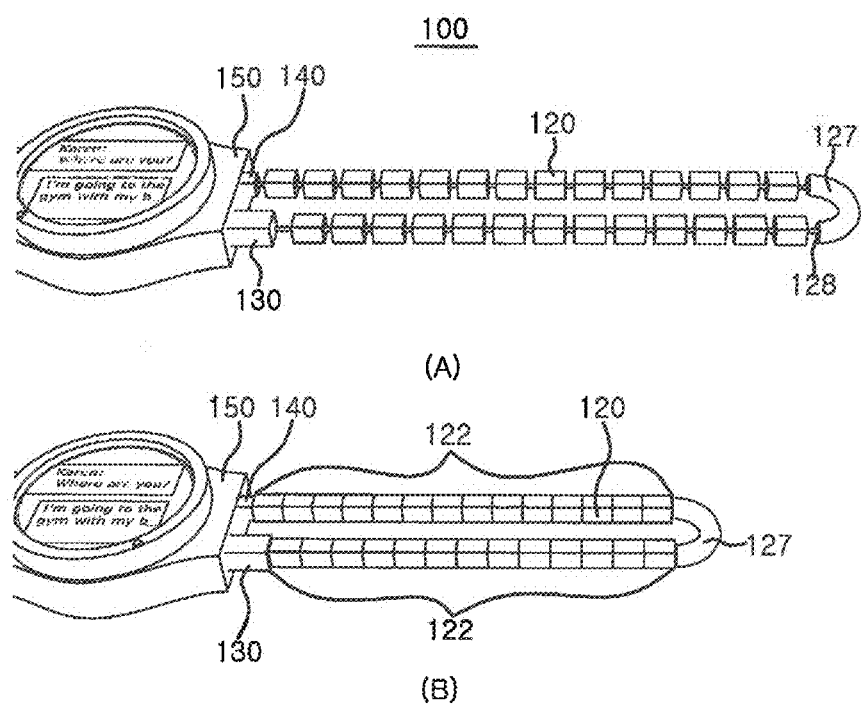

In addition, it is conceivable to use a method of attaching the stopper 130 to the blocking member 140 or the main body 150 as shown in FIG. 7D. In order to implement the embodiment shown in FIG. 7D, one of the movable members 120 may be formed in a shape different from that of the remaining movable members 120 as shown in (A) of FIG. 7D. One movable member 120 having such a different shape is referred to as an intermediate member 127 for the sake of convenience. The through hole 128 of the intermediate member 127 may be formed in a semicircular shape so that both ends of the through hole 128 can face the blocking member 140 or the main body 150. To this end, the outer appearance of the intermediate member 127 may be made to have a semicircular shape as shown in FIG. 7D.

In the embodiment shown in FIG. 7D, when the wire 110 is pulled toward the main body 150 as much as possible, due to the existence of the blocking member 140 or the stopper 130 attached to the main body 150 and the existence of the intermediate member 127 for changing the extension direction of the wire 110, it is possible to achieve an effect that the two support bodies 122 are attached to one blocking member 140 as shown in (B) of FIG. 7D. That is, the effect similar to that of the embodiment of FIG. 7C can be obtained through the embodiment of FIG. 7D. In order for the embodiment of FIG. 7D to operate as desired, it is required to arrange the movable members 120 so that the distance between the passage 141 of the blocking member 140 and the intermediate member 127 becomes equal to the distance between the stopper 130 and the intermediate member 127 in a state in which the wire 110 is pulled toward the main body 150 as much as possible.

Figure 8A:
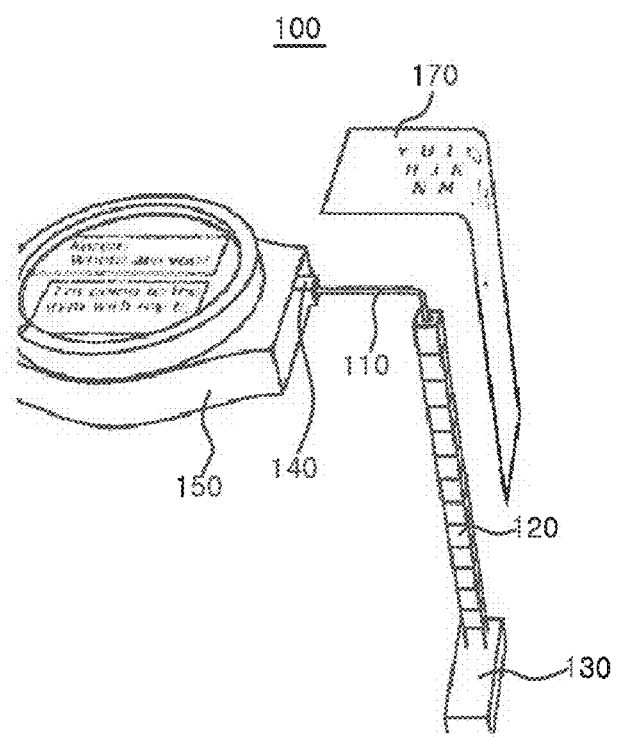
FIGS. 8A to 8D are views for explaining an embodiment in which a flexible device according to an embodiment of the present invention is prevented from being excessively bent.

FIGS. 8A to 8D are views for explaining an embodiment for preventing the flexible device according to the embodiment of the present invention from being excessively bent. When the wire 110 is not pulled toward the main body 150 as much as possible, the movable members 120 may be moved toward the stopper 130 as shown in FIG. 8A. In such a state, the portion of the wire 110 not occupied by the movable members 120 may be sharply bent, which may cause the flexible display 170 to be folded and damaged. In order to solve this problem, according to an embodiment of the present invention, a method of adjusting the distance between the movable members 120 moving on the wire 110 may be proposed.

Figure 8B:
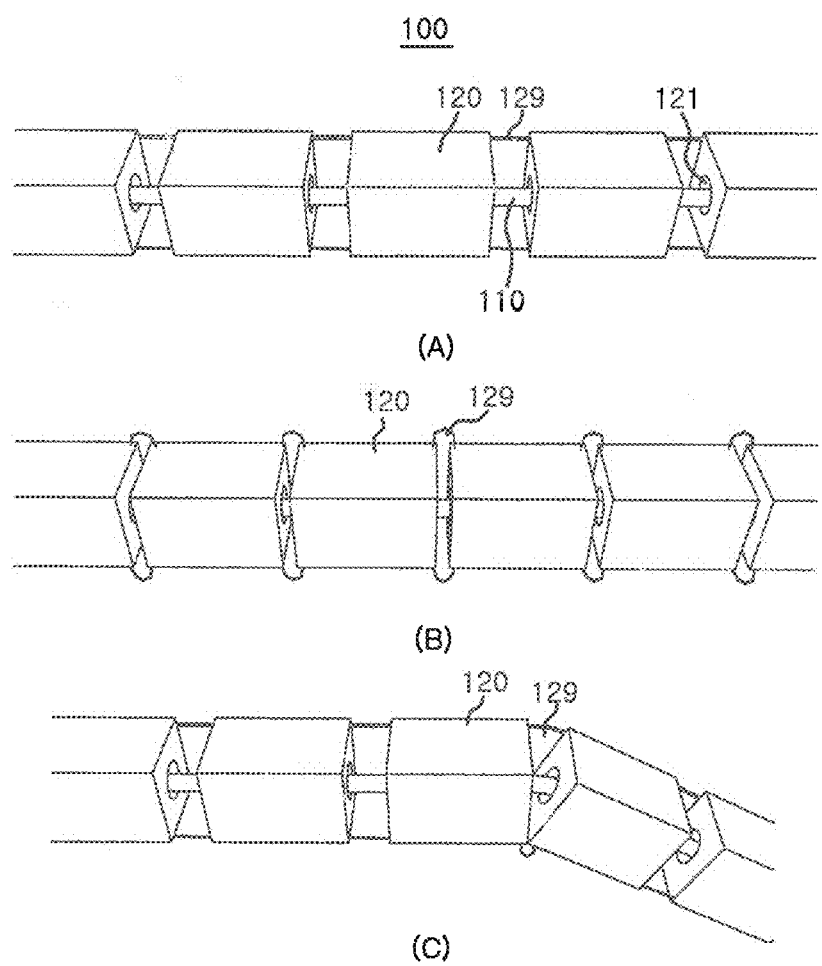

Referring to FIG. 8B, it can be seen that each movable member 120 is connected to the adjacent movable member 120 through a connecting member 129. Such a connecting member 129 may be made of a material which can be bent by a pressing force (compression force) exerted in the longitudinal direction at both ends but is not stretched by a pulling force (tensile force) exerted in the longitudinal direction, i.e., a flexible and non-stretchable material. Accordingly, the gap between two adjacent movable members 120 cannot exceed a predetermined threshold gap defined by the length of the connecting member 129 as shown in (A) of FIG. 8B. On the other hand, as shown in (B) of FIG. 8B, the gap between the two adjacent movable members 120 may become narrower than the threshold gap due to the flexibility of the connecting member 129.

FIG. 8B shows that two connecting members 129 may be used to connect the two adjacent movable members 120. However, the present invention is not limited thereto. Three or more connecting members 129 may be used. The movable member 120 adjacent to the stopper 130 may be connected to the stopper 130 through the connecting member 129, and the movable member 120 adjacent to the blocking member 140 may be connected to the blocking member 140 through the connecting member 129.

According to the embodiment of FIG. 8B, as shown in (C) of FIG. 8B, the degree of bending of the wire 110 may be limited to a certain level or less by the action of the connecting member 129. As a result, it is possible to prevent the flexible display 170 from being excessively bent, thereby preventing the flexible display 170 from being damaged.

Figure 8C:
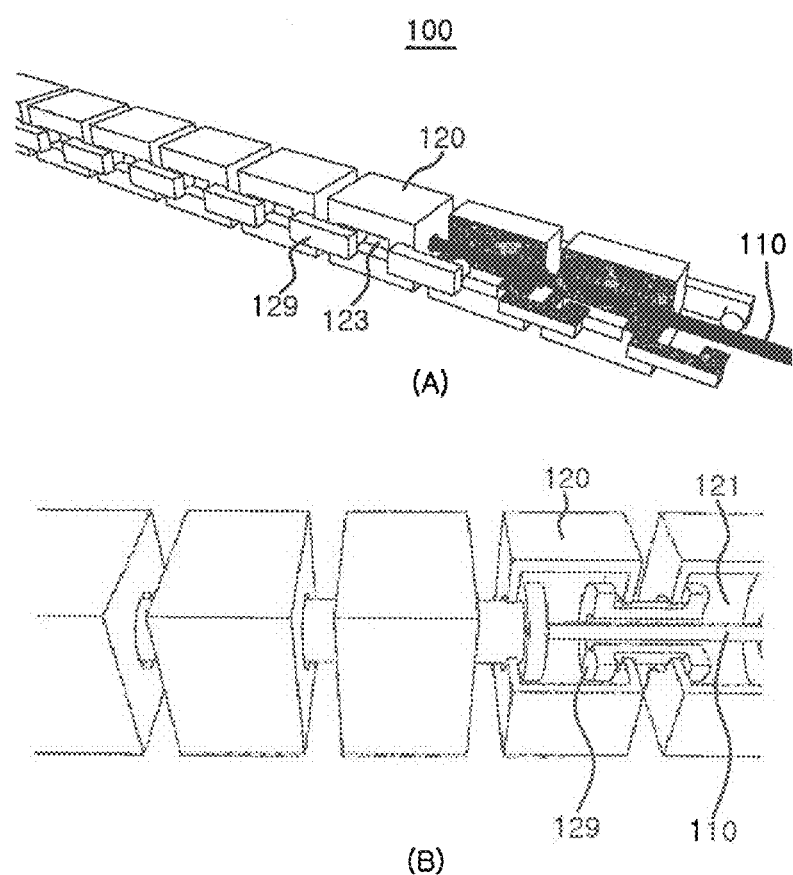

FIG. 8C shows another embodiment for preventing the flexible display 170 from being excessively bent. According to FIG. 8C, it can be seen that the connecting member 129 is not necessarily made of a flexible material but may be made of a hard material. Referring first to (A) of FIG. 8C, it can be noted that a groove 123 is formed on the side surface of each movable member 120 and a connecting member 129 is inserted into the groove 123. At this time, the connecting member 129 inserted into the groove 123 formed in one of the two adjacent movable members 120 may be attached to the other of the two movable members 120 or may be inserted into the groove 123 formed in the other of the two movable members 120. Through such a structure, the distance between the adjacent movable members 120 may be adjusted to a predetermined threshold distance or less.

Alternatively, the connection member 129 may be formed in a dumbbell-like structure surrounding the wire 110 as shown in (B) of FIG. 8C. The connecting member 129 may move along the wire 110 extending through the connecting member 129. The diameter of the central portion of the connecting member 129 may be smaller than the diameter of the inlet of the through hole 121 of the movable member 120, and the diameter of opposite end portions of the connecting member 129 may be larger than the diameter of the inlet of the through hole 121 of the movable member 120. In addition, a space large enough to accommodate the opposite end portions of the connecting member 129 may be formed in the movable member 120.

Under the conditions described above, the central portion of one connecting member 129 may extend through the inlets of the mutually-facing through holes 121 of the two adjacent movable members 120. One of the opposite end portions of the connecting member 129 may be positioned inside one of the two adjacent movable members 120 and the other of the opposite end portions of the connecting member 129 may be positioned inside the other movable member 120. Thus, there is no limit in reducing the gap between the two adjacent movable members 120. However, the maximum extendable range may be limited not to exceed the distance between the opposite end portions of the connecting member 129.

Figure 8D:
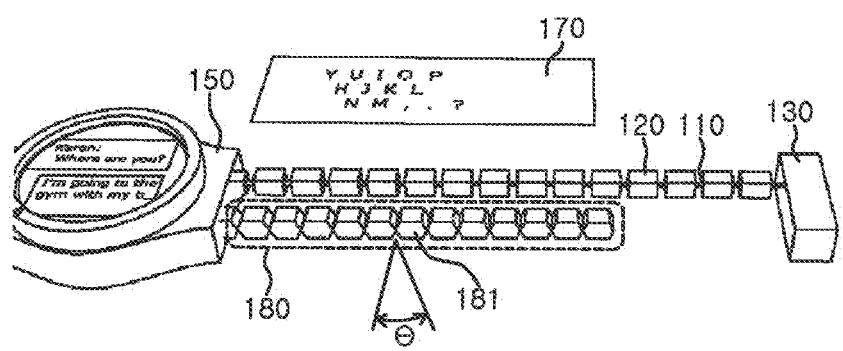
Figure 8D:
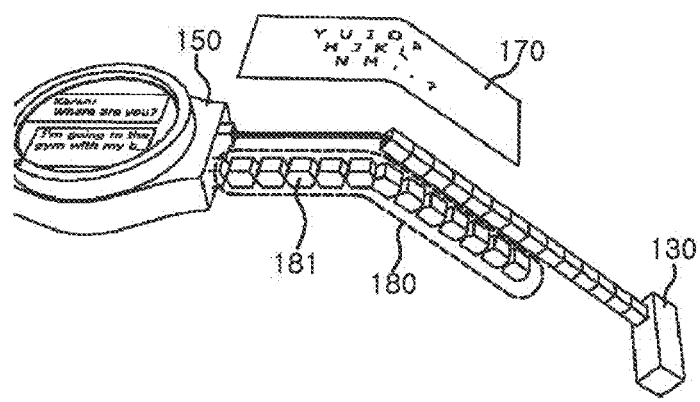

The anti-folding function of the flexible device 170 cannot be achieved only by adjusting the distance between the movable members 120 through the connecting member 129. Referring to FIG. 8D, a curvature adjustment portion 180 extending toward the stopper 130 may be attached to the blocking member 140 in parallel to the wire 110. The curvature adjustment portion 180 may include a plurality of unit members 181 coupled to each other in a row.

As shown in (A) of FIG. 8D, each of the unit members 181 may have a polyhedral shape. The shape of the unit members 181 may be adjusted so that the angle θ formed by the surfaces of two adjacent unit members 181, in a state in which the curvature adjustment portion 180 is linearly straightened, is equal to or smaller than a predetermined threshold angle. Then, as can be seen in (B) of FIG. 8D, the degree of bending of the curvature adjustment portion 180 may be adjusted to a certain level or less. That is, the curvature of the arc formed by connecting the centers of the unit members 181 may be adjusted not to exceed a predetermined threshold curvature.

The curvature adjustment portion 180 may be mounted inside the body 160 to extend in the longitudinal direction of the body 160. It is preferred that the curvature adjustment portion 180 extend at least to the corner of the flexible display 170 farthest from the blocking member 140. Under the action of the curvature adjustment portion 180 described above, the body 160 is not bent beyond the threshold curvature. As a result, it is possible to prevent the flexible display 170 from being excessively folded and damaged.

Figure 9A:
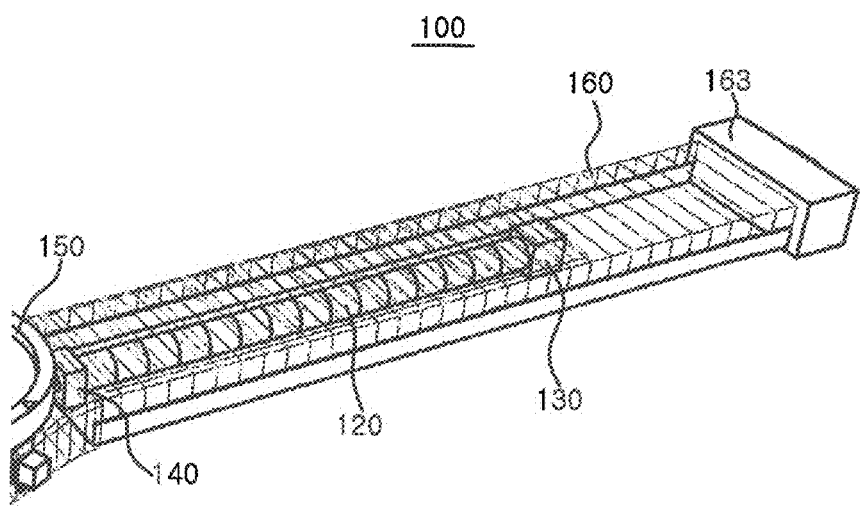
FIGS. 9A to 9D are views for explaining an embodiment in which a bending suppression effect is achieved in the entire region of a flexible device according to an embodiment of the present invention.

FIGS. 9A to 9D are views for explaining an embodiment in which a bending suppression effect is achieved in the entire region of a flexible device according to an embodiment of the present invention. As described above with reference to FIGS. 8A to 8D, the flexible device 100 may be excessively folded when the wire 110 is not pulled toward the main body 150. As shown in FIG. 9A, even in a state in which the wire 110 is pulled to the maximum toward the main body 150, a space exists between the stopper 130 and the fixing member 163. Thus, the portion of the body 160 surrounding the space may be bent or folded.

In order to prevent such a problem, a curvature preventing portion 190 made of a hard material may be provided in the body 160 between the stopper 130 and the fixing member 163. A structure called a "bellows" may be employed as the structure of the curvature preventing portion 190. However, the present invention is not limited thereto.

Figure 9B:
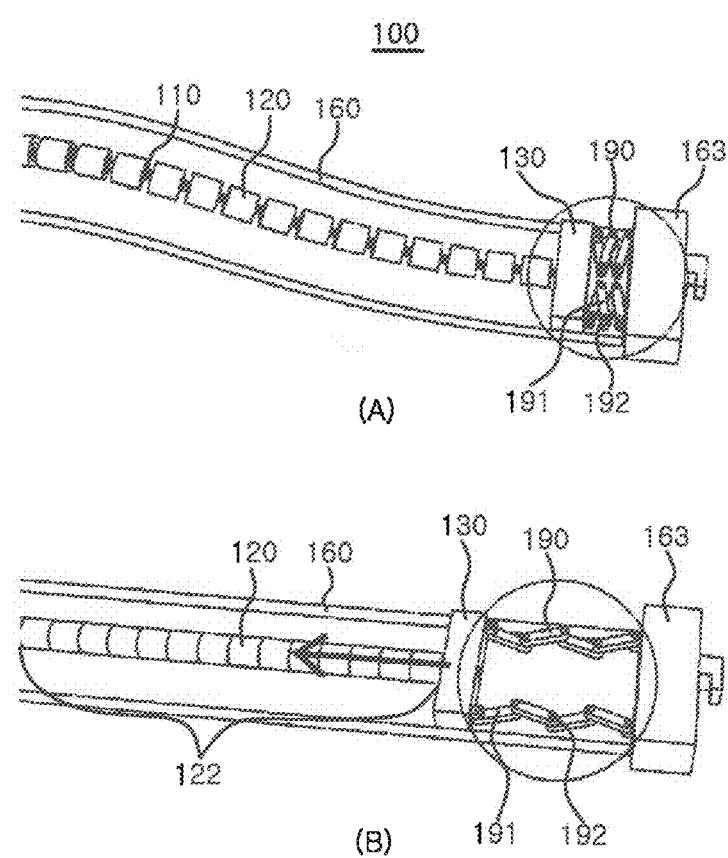

Referring to FIG. 9B, the curvature preventing portion 190 may be constituted by a plurality of rod-shaped frames 191 coupled to each other in a row. Two adjacent frames 191 may be coupled to each other by a joint 192. More specifically, two adjacent frames 191 may be positioned such that the end portions thereof can partially overlap with each other. The joint 192 may penetrate both of the two adjacent frames 191 in the overlapping region. The two frames 191 coupled through the joint 192 may make rotational movement about the joint 192.

One end of the curvature preventing portion 190 configured as described above may be attached to the fixing member 163, and the other end thereof may be attached to the stopper 130. In FIG. 9B, two curvature preventing portions 190 are present between the stopper 130 and the fixing member 153. However, the present invention is not limited thereto. One or three or more curvature preventing portions 190 may exist.

Figure 9C:
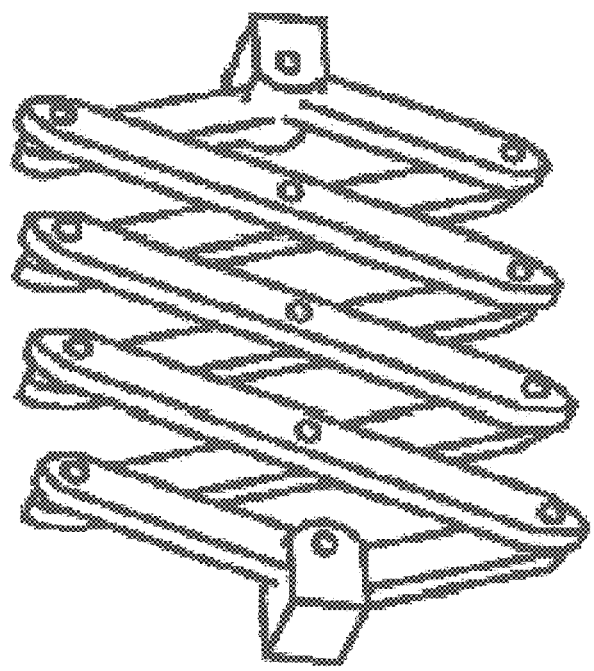

(A) of FIG. 9B shows the curvature preventing portion 190 when the wire 110 is not pulled toward the main body 150. In this state, if the wire 110 is pulled toward the main body 150 and the stopper 130 is moved away from the fixing member 163 as shown in (B) of FIG. 9B, the folded curvature preventing portion 190 may be unfolded and stretched. As described above, the curvature preventing portion 190 may be formed of a hard material. Therefore, the curvature preventing portion 190 may prevent the portion of the body 160 surrounding the space between the stopper 130 and the fixing member 163 from being bent or folded. FIG. 9C shows another implementation example of the curvature preventing portion 190. The curvature preventing portion 190 may be any one as long as the distance from one end to the other end can be adjusted by an external force. In addition, the elastic member 164 described with reference to FIGS. 6A and 6B may be mounted between the stopper 130 and the fixing member 163 together with the curvature preventing portion 190.

Figure 9D:
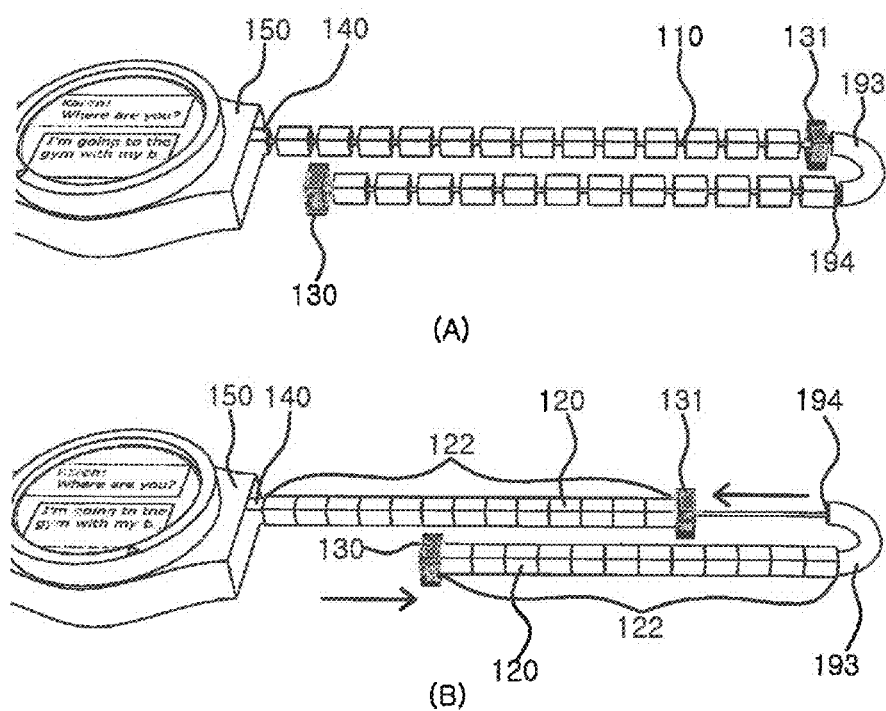

As a means for achieving the bending suppression effect in the entire region of the body 160, a non-moving member 193 of FIG. 9D may be employed instead of the curvature preventing portion 190. The non-moving member 193 may be fixed at a predetermined position in the body 160. In order to maximize the bending suppression effect, it is preferable that the non-moving member 193 is attached to the fixing member 163.

The non-moving member 193 may have a through hole 194 through which the wire 110 extends. The wire 110 may freely move in the through hole 194, but the movable member 120 cannot pass through the through hole 194 due to its size. Similar to the intermediate member 127 described above with reference to FIG. 7D, the through hole 194 of the non-moving member 193 may be formed in a semicircular shape. More specifically, both ends of the through hole 194 may be formed to face the blocking member 140 or the main body 150. Therefore, the outer appearance of the non-moving member 193 may also be formed to have a semicircular shape as shown in FIG. 9D.

The portion of the wire 110 existing inside the body 160 may be divided into two portions with the non-moving member 193 used as a boundary. At this time, the portion between the blocking member 140 and the non-moving member 193 may be referred to as a first portion, and the portion between the non-moving member 193 and the stopper 130 may be referred to as a second portion. The movable members 120 may be divisionally present in the first portion and the second portion as shown in FIG. 9D. A second stopper 131 which is separate from the stopper 130 and which serves to limit the movement of the movable members 120 like the stopper 130 may be fixedly installed at a predetermined position on the first portion of the wire 110. The second stopper 131 may have such a size that it cannot pass through the through hole 121 of the movable member 120 and the through hole 194 of the non-moving member 193.

(A) of FIG. 9D shows a state in which the wire 110 is not pulled toward the main body 150 in the present embodiment using the non-moving member 193 and the second stopper 131. According to (A) of FIG. 9D, it can be seen that the wire 110 extending away from the blocking member 140 passes through the through hole 194 of the non-moving member 193, converts its extending direction toward the blocking member 140 to reach the stopper 130.

When the wire 110 is pulled toward the main body 150 as much as possible in the state shown in (A) of FIG. 9D, as shown in (B) of FIG. 9D, the movable members 120 in the first portion make close contact with each other between the blocking member 140 and the second stopper 131, and the movable members 120 in the second portion make close contact with each other between the stopper 130 and the non-moving member 193. In this way, two support bodies 122 may be provided in parallel for the first and the second portion, respectively. Needless to say, the lengths of the first portion and the second portion when the wire 110 is pulled toward the main body 150 to the maximum need to be appropriately adjusted so that the support bodies 122 can be simultaneously provided in the first portion and the second portion. In addition, the number of the movable members 120 existing in each portion needs to be adjusted appropriately.

According to (B) of FIG. 9D, the entire portion of the body 160 may be supported by at least one of the two support bodies 122. Therefore, it is possible to achieve a bending suppression effect over the entire portion of the body 160 and the flexible display 170. In addition, since two support bodies 122 are parallel to each other, the distortion of the body 160 and the flexible display 170 can also be prevented by the principle similar to the embodiment of FIG. 7C or 7D.

Figure 10A:
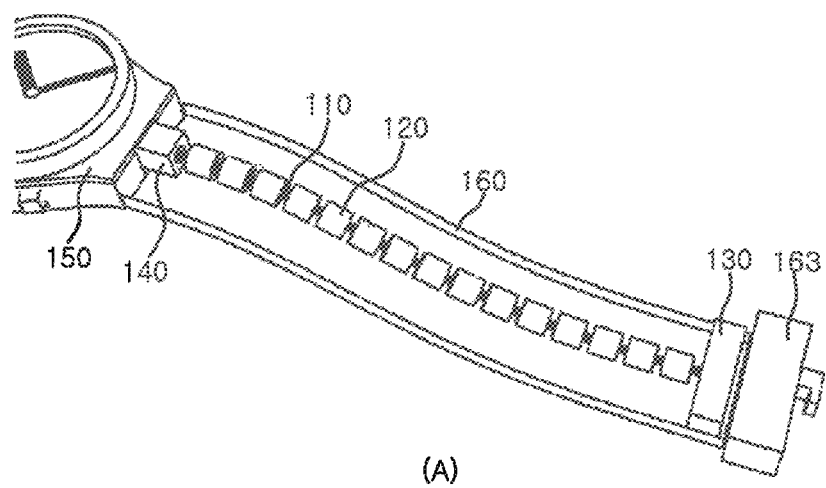
FIGS. 10A and 10B are views for explaining another implementation form of a flexible device according to an embodiment of the present invention.
Figure 10A:
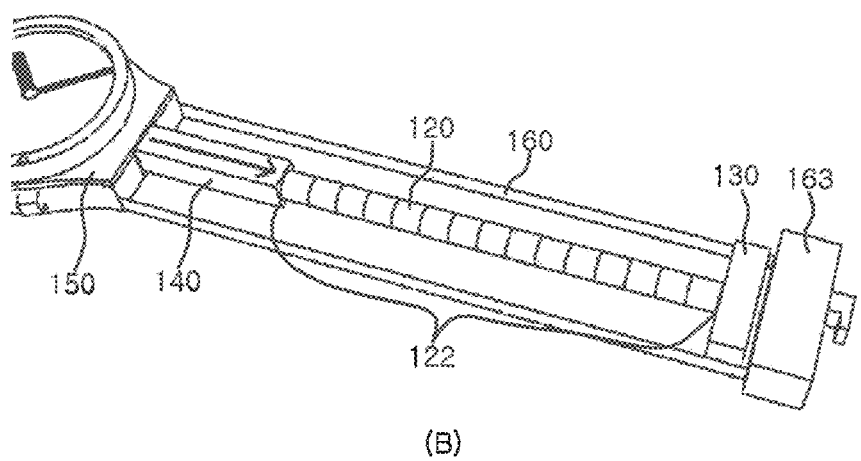
Figure 10B:
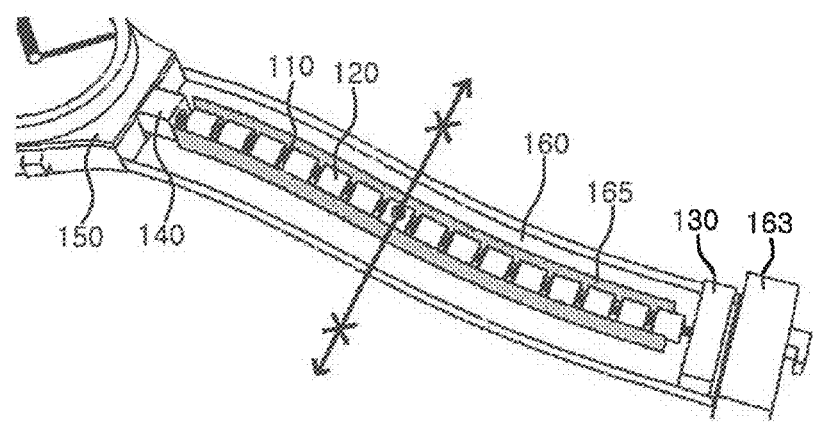

FIGS. 10A and 10B are views for explaining another implementation form of a flexible device according to an embodiment of the present invention. In the flexible device 100 described so far with reference to FIGS. 2A to 9D, the support body 122 composed of the movable members 120 is formed by pulling the wire 110 toward the main body 150. Alternatively, according to FIG. 10A, by moving the blocking member 140 toward the stopper 130 without pulling the wire 110, the movable members 120 may be brought into close contact with each other to form the supporting body 122.

The flexible device 100 shown in (A) of FIG. 10A may basically have the same structure as the flexible device 100 described with reference to FIGS. 3A to 4B. The flexible device 100 shown in (A) of FIG. 10A has features that the stopper 130 is fixed at a predetermined position in the body 160 and that the blocking member 140 may move or extend from the main body 150 toward the stopper 130. Specifically, the blocking member 140 may be moved or extended by the operating member 153 without moving the wire 110. There is no particular limitation on the position where the stopper 130 is fixed, but in order to achieve the bending suppression effect over the entire region of the body 160, it is preferable that the stopper 130 is attached to or integrally formed with the fixing member 163.

Referring to (A) of FIG. 10A, the distance between the blocking member 140 and the stopper 130 is longer than the sum of the lengths of the through holes 121 of the respective movable members 120. Therefore, the wire 110 may be bent together with the body 160. Alternatively, if the blocking member 140 is moved or extended toward the stopper 130 until the movable members 120 form the integrated support body 122 as shown in (B) of FIG. 10A, it is possible to suppress the bending of the wire 110 and the body 160. That is, the user of the flexible device 100 may suppress the bending of the body 160 by a simple operation of pushing the blocking member 140 toward the stopper 130. In order to allow the body 160 to be bent again, it is only necessary to move the blocking member 140 in the opposite direction, i.e., in the direction away from the stopper 130. According to the embodiment of FIG. 10A, when the stopper 130 is sufficiently close to the fixing member 163, it is possible to prevent the excessive folding of the body 160 and the flexible display 170 mounted on the body 160. Thus, no additional configuration is necessary.

FIG. 10B is a view showing a flexible device 100 further including a rail member 165 surrounding the wire 110 and the movable members 120. The rail member 165 may be made of a flexible material so as not to disturb the bending of the wire 110 and the body 160 and may be mounted at a predetermined position in the body 160 to surround the movable members 120 as shown in FIG. 10B. The movement of the movable members 120 or the blocking member 140 may be guided by the rail member 165. As a result, it is possible to prevent the wire 110 and the movable members 120 from wobbling in the direction perpendicular to the extension direction of the wire 110.

It is needless to say that such a rail member 165 may be applied not only to the flexible device 100 of FIG. 10A but also to the flexible device 100 described above with reference to other drawings. In this case, the stopper 130 may also be guided by the rail member 165 like the movable members 120. Instead of installing the rail member 165, the space in the body 160 other than the minimum space in which the movable members 120 and the blocking member 140 can move may be filled with a material identical with or similar to the body 160. In some embodiments, an elongated groove may be formed on the inner wall of the body 160 so that the movable members 120 and the blocking member 140 can move within a range not deviating from the groove.

Figure 11A:
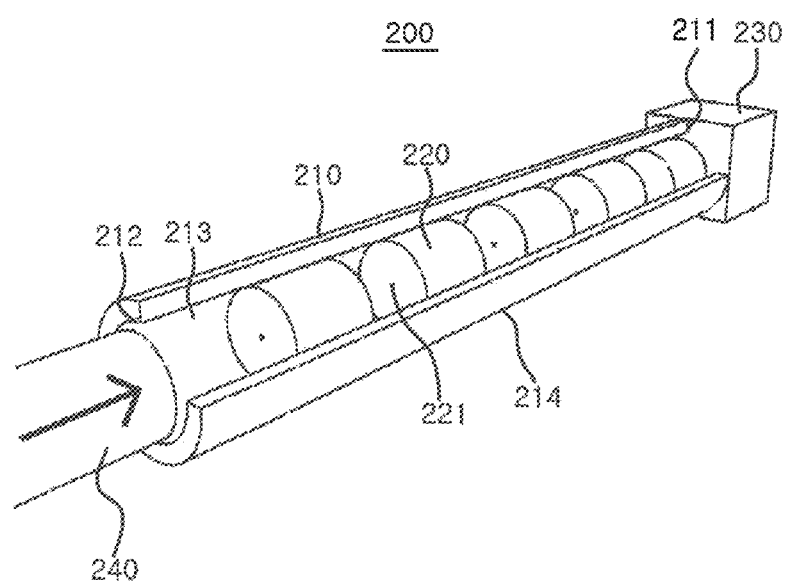
FIGS. 11A and 11B are views for explaining an implementation form in which no wire is used in a flexible device according to an embodiment of the present invention.
Figure 11B:
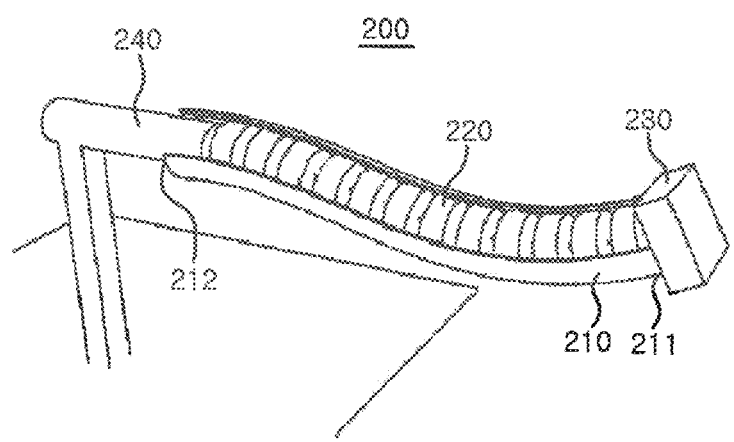
Figure 11B:
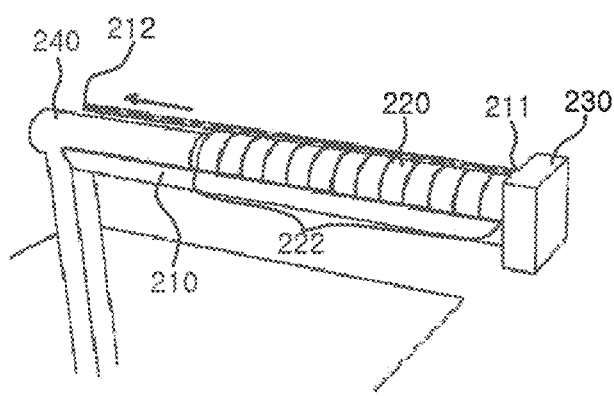

Up to now, the embodiments in which the moving path of the movable members 120 is provided by the wire 110 have been described with reference to FIGS. 3A to 10B. However, according to the present invention, it is also possible to implement an embodiment in which the wire 110 is not used. FIGS. 11A and 11B are views for explaining an implementation form in which no wire is used in the flexible device according to the embodiment of the present invention. The flexible device 200 shown in FIGS. 11A and 11B may include a flexible member 210, movable members 220, a stopper 230 and a blocking member 240.

Referring to FIG. 11A, the flexible member 210 may have a tube shape with a space 213 formed therein and may have flexibility so that the flexible member 210 can be freely bent in a direction other than the longitudinal direction. According to FIG. 11A, the flexible member 210 is formed in the shape of a cylinder having a circular cross section, but the present invention is not necessarily limited thereto. The shape of the internal space 213 of the flexible member 210 and the external shape may be different from each other. For example, even if the internal space 213 of the flexible member 210 is cylindrical, the external shape may be a rectangular parallelepiped shape.

A plurality of movable members 220 may be positioned in the internal space 213 of the flexible member 210. The movable members 220 may be arranged in a line in the internal space 213 and may move through the internal space 213 in the longitudinal direction of the flexible member 210. That is, the internal space 213 may serve as a path through which the movable members 220 can move.

The cross section of the movable member 220 may be set to have the same size and shape as the cross section of the internal space 213 of the flexible member 210. In this case, due to the pressure of the air existing between the adjacent movable members 220, the movement of the movable members 220 may not be smooth. In order to solve this problem, a through hole 221 may be formed in each movable member 220. The through hole 221 may be formed in parallel with the movement path of the movable member 220 moving in the internal space 213, thereby facilitating the flow of the air in the internal space 213.

The stopper 230 may be provided at one end 211 of the flexible member 210 to prevent the movable members 220 from being separated from the internal space 213 of the flexible member 210. As a preferred example, the stopper 230 made of a hard material may be attached to one end 211 of the flexible member 210. Thus, as shown in FIG. 11A, the internal space 213 of the flexible member 210 can be prevented from being exposed to the outside through the one end 211 of the flexible member 210.

The blocking member 240 may be provided at the other end 212 of the flexible member 210 and may move or extend into the internal space 213 of the flexible member 210, i.e., toward the stopper 230. By moving or extending the blocking member 240 in this way, the adjacent movable members 220 may be brought into close contact with each other. Thus, the movable members 220 may form a single support body 222 which can be brought into close contact with the stopper 230 and the blocking member 240. The movable members 220 and the blocking member 240 may be made of a hard material. Therefore, the bending of the flexible member 210 may be suppressed in a state in which the support body 222 is in close contact with the stopper 230 and the blocking member 240. When the blocking member 240 moves away from the stopper 230 and returns to its original position, the flexible member 210 may be bent again.

In order to achieve the aforementioned function, it is required that the distance between the stopper 230 and the blocking member 240 in a state in which the support body 222 is in close contact with the stopper 230 and the blocking member 240, i.e., the length of the support body 222, is shorter than the length of the internal space 213 of the flexible member 210, i.e., the total length of the path through which the movable members 220 can move.

The flexible member 210 may serve as the body 160 of the flexible device 100 shown in FIGS. 3A to 10B. Therefore, a flexible display (not shown) may be attached to the surface 214 of the flexible member 210 exposed to the outside. Thus, the flexible device 200 of FIG. 11A may have a simpler structure than the flexible device 100 of FIGS. 3A to 10B in which the wire 110 and the body 160 exist as separate components. Meanwhile, for easy attachment and use of the flexible display, the surface 214 of the flexible member 210 may be formed to have a flat shape instead of a curved surface.

In order to form the support body 222, instead of moving the blocking member 240, the flexible member 210 may be moved as in the embodiment of FIG. 11B. In the flexible device 200 of (A) of FIG. 11B, the adjacent movable members 220 are not in close contact with each other and the flexible member 210 may be bent. In this state, by pulling the flexible member 210, it is possible to allow the movable members 220 to form one support body 222. As a result, the bending of the flexible member 210 may be suppressed. In the flexible device 200 according to the embodiment of FIG. 11B, the flexible member 210, which is relatively easily manufactured to have a larger volume as compared with the blocking member 240, is the subject of movement. Thus, there is an advantage that the flexible device 200 can be easily operated by the user.

Figure 12A:
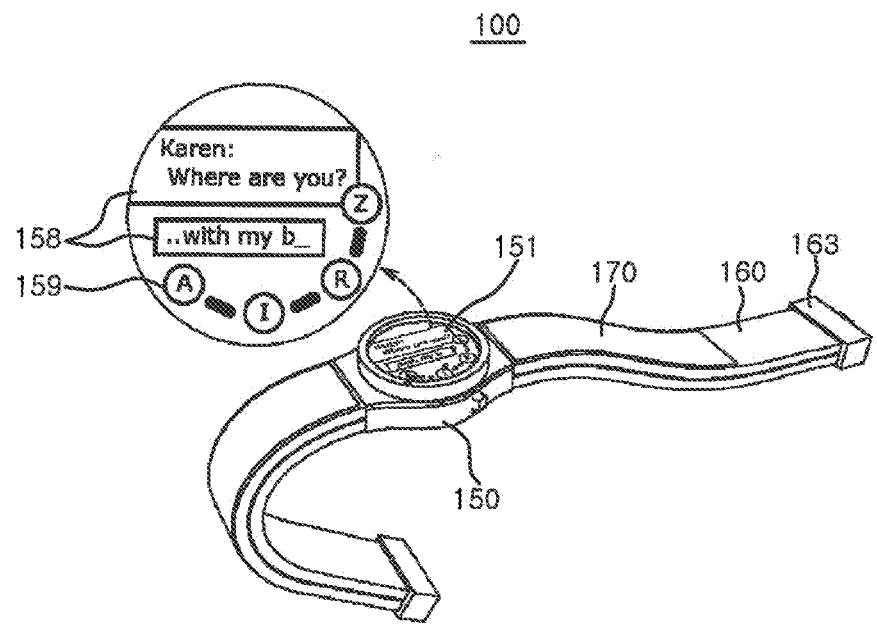
FIGS. 12A to 12C are views for explaining the operation state switching in a flexible device according to an embodiment of the present invention.
Figure 12A:
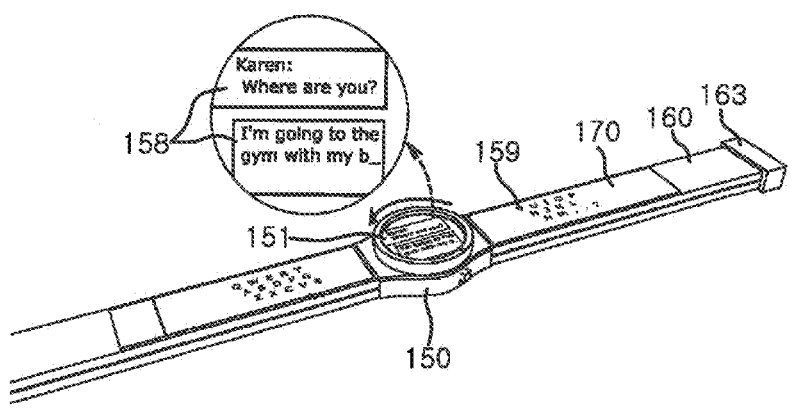
Figure 12B:
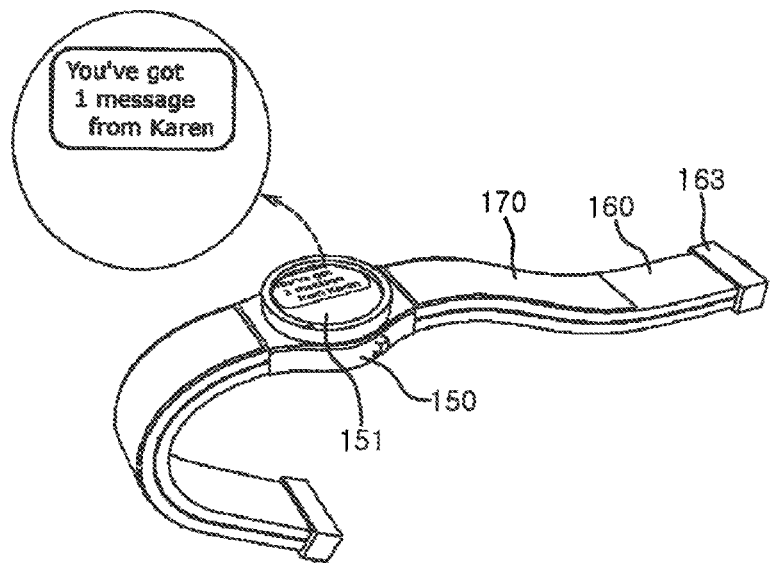
Figure 12B:
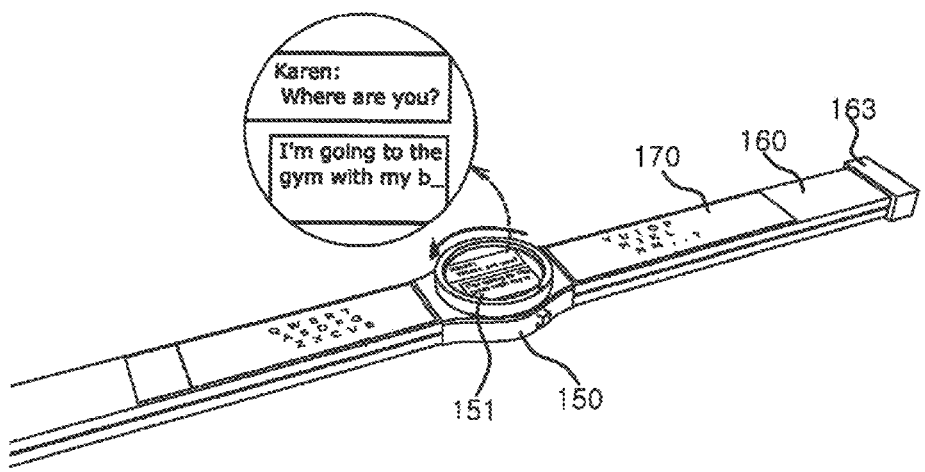
Figure 12C:
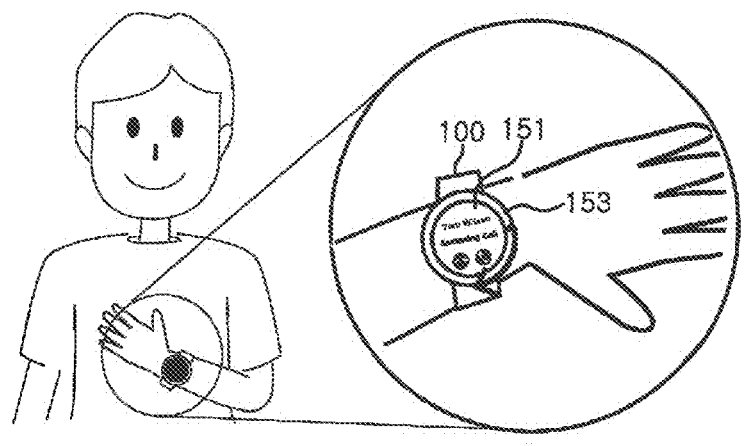
Figure 12C:
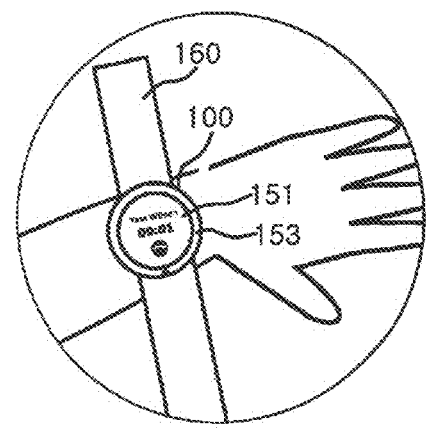
Figure 12C:
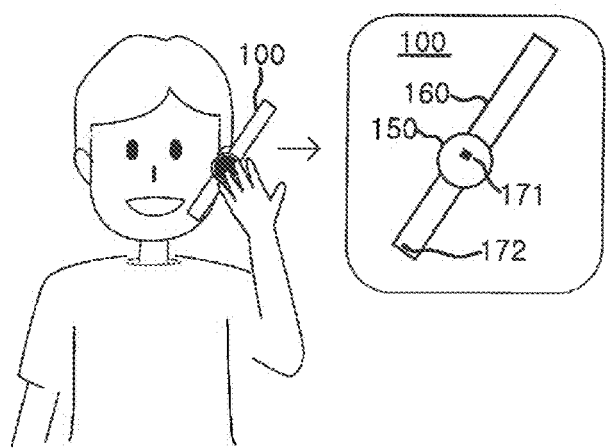

FIGS. 12A to 12C are views for explaining a state conversion of a flexible device according to an embodiment of the present invention. It is assumed that the flexible device 100 of FIGS. 12A to 12C has basically the same configuration as that of the flexible device 100 shown in FIG. 3A to 3C.

The flexible display 170 included in the flexible device 100 of FIGS. 12A to 12C may be differently operated depending on whether the bending of the flexible display 170 is suppressed as the movable members 120 form the integrated support body 122 and make close contact with the stopper 130 and the blocking member 140 (or whether the bending of the body 160 is suppressed when the flexible display 170 is not mounted on the body 160). For example, the flexible display 170 may be operated such that the flexible display 170 is turned on only in a state in which the bending thereof is suppressed and turned off in a state in which the bending thereof is not suppressed.

Needless to say, the type of the function activated only when the bending of the flexible display 170 or the body 160 is suppressed is not limited to the on/off control of the flexible display 170. For example, the function activated only when the bending is suppressed may be related to a component of the flexible device 100 other than the flexible display 170 (e.g., a change in the display state of the flat display 151).

In order to implement the above-described function, the flexible device 100 may further include a sensor unit (not shown) for detecting whether the bending of the flexible display 170 is suppressed. For example, in order to detect whether the bending is suppressed, the sensor unit may detect whether the position adjusting member 113 is actually present at a predetermined position when the wire 110 is pulled toward the main body 150 to the maximum. If the position adjusting member 113 is present at the predetermined position, the sensor unit may determine that the bending of the flexible display 170 is suppressed. If the position adjusting member 113 is not present at the predetermined position, the sensor unit may determine that the bending of the flexible display 170 is not suppressed.

Meanwhile, the flexible device 100 may further include a control unit (not shown) implemented by a computing device such as a microprocessor or the like. The control unit may generate a command for driving the flexible display 170 based on a detection signal generated by the sensor unit, and may further generate a command for controlling the flat display 151 provided in the main body 150. By the operation of the sensor unit and the control unit, the flexible display 170 may be operated differently depending on whether the bending thereof is suppressed. The specific configuration and operation principle of the sensor unit and the control unit are obvious to those of ordinary skill in the art and, therefore, will not be described here in detail.

The flexible display 170 may operate in conjunction with the flat display 151 provided in the main body 150. For example, in the state of (A) of FIG. 12A in which the bending of the flexible display 170 is not suppressed, the flexible display 170 may be turned off so that all the functions or information for the user are displayed on the flat display 151. However, in the state in which the bending of the flexible display 170 is suppressed as shown in (B) of FIG. 12A, the flexible display 170 is turned on so that some of the functions or information provided through the flat display 151 may be provided through the flexible display 170.

According to the example of FIG. 12A, the flexible display 170 is turned off in the state (A). Therefore, both a display window 158 and a touch input part 159 for inputting characters are outputted on the flat display 151. In the state (B), however, the flexible display 170 is turned on. Thus, only the display window 158 may be provided through the flat display 151, and the touch input part 159 may be provided through the flexible display 170. Since the flexible display 170 may have a larger area than the flat display 151, the user may conveniently perform character input using the flexible display 170.

FIG. 12B is a view for explaining another example of utilization of the flexible display 170. (A) of FIG. 12B shows a situation where a text message arrives in a state in which the bending of the flexible display 170 is not suppressed. In such a situation, the flat display 151 may output a notification message to notify that the text message has arrived. At this time, if the bending of the flexible display 170 is suppressed so that the flexible display 170 can be straightened and turned on as shown in FIG. 12B (B), the flat display 151 may output a display window for displaying the contents of the text message. In addition, a touch input part for inputting a response message to the text message may be provided on the flexible display 170.

As described above, when the condition of bending suppression of the flexible display 170 is satisfied, the predetermined function such as the ON-state switching of the flexible display 170 or the output of the touch input part may be automatically activated. The user of the flexible device 100 may use the flexible device 100 more conveniently because an operation other than the operation for suppressing the bending of the flexible display 170 is not required for the activation of the function.

FIG. 12C is a view for explaining another embodiment related to the use of a smart watch type flexible device 100. Referring to (A) of FIG. 12C, the smart watch type flexible device 100 that can be worn on the user's wrist may have a function as a telephone, especially as a portable wireless communication terminal capable of making wireless communication. When an incoming signal for telephone conversation is received in the flexible device 100, a screen informing that a call has arrived may be outputted on the flat display 151. At this time, the user may suppress the bending of the body 160 by rotating the operating member 153, so that the flexible device 100 can be brought into the same state as an unbendable hard device.

As soon as the bending of the body 160 of the flexible device 100 is suppressed, the flexible device 100 may initiate the telephone conversation based on the incoming signal so that the user can make a call with the party who has transmitted the incoming signal. That is, the user may obtain two results of the deformation of the flexible device 100 and the call initiation through one operation of rotating the operating member 153.

According to (B) of FIG. 12C, a voice output unit 171 such as a speaker or the like may be mounted on the main body 150 of the flexible device 100, and a voice input unit 172 such as a microphone or the like may be mounted on the body 160. That is, the voice output unit 171 and the voice input unit 172 are spatially separated from each other so that the voice output unit 171 and the voice input unit 172 can be brought close to the user's ear and mouth, respectively. Accordingly, it is possible for the user to use the bending-suppressed flexible device 100 as a general mobile phone.

Unlike the above description, the voice output unit 171 may be mounted on the body 160, and the voice input unit 172 may be mounted on the main body 150. It is also possible to mount both the voice output unit 171 and the voice input unit 172 on either of the main body 150 or the body 160 as long as the above-described spatial separation can be achieved. The positions of the voice output unit 171 and the voice input unit 172 may be determined such that the voice output unit 171 and the voice input unit 172 can be spaced apart from each other by a predetermined distance or more in a state in which the bending of the flexible device 100 is suppressed.

In the above-described example, it has been described that the operation of rotating the operating member 153, i.e., the operation of suppressing the bending of the flexible device 100 may be integrated with the operation of receiving a telephone call. However, the type of the operation to be integrated with the bending suppression operation may vary depending on the situation. For example, when a text message is received in the flexible device 100, if the user suppresses the bending of the flexible device 100 by rotating the operating member 153, the flexible device 100 may simultaneously make sure that a text input window for sending a reply to a text message can be outputted on the flexible display 170.

Meanwhile, the functions such as the start of telephone conversation or the output of the character input window described with reference to FIG. 12C may be realized only in a state in which the bending of the flexible device 100 is suppressed through the rotation of the operating member 153. For example, when the body 160 is straightened by placing the flexible device 100 on a desk or a table, it appears apparently that the bending of the flexible device 100 is suppressed. However, in reality, the body 160 may be bent if the flexible device 100 is lifted. Thus, the aforementioned function may not be realized. With this feature, it is possible to prevent the malfunction of the flexible device 100 which is not intended by the user.

Figure 13A:
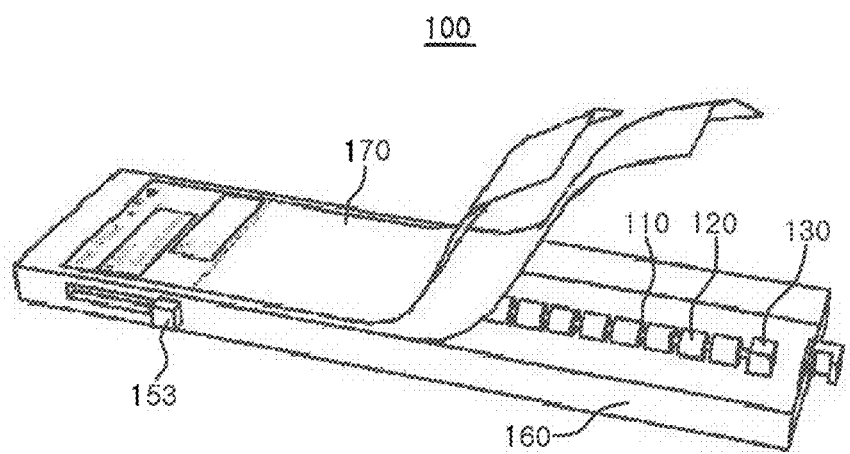
FIGS. 13A and 13B are views for explaining another implementation form of a flexible device according to an embodiment of the present invention.
Figure 13B:
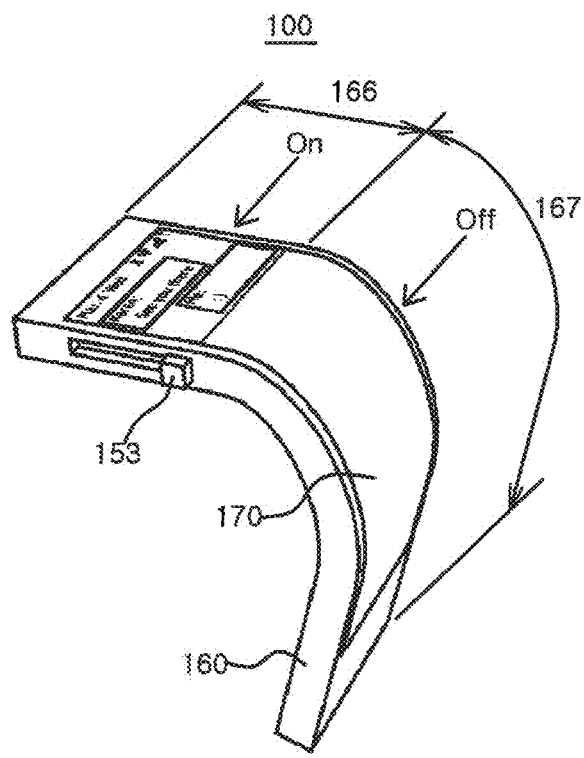
Figure 13B:
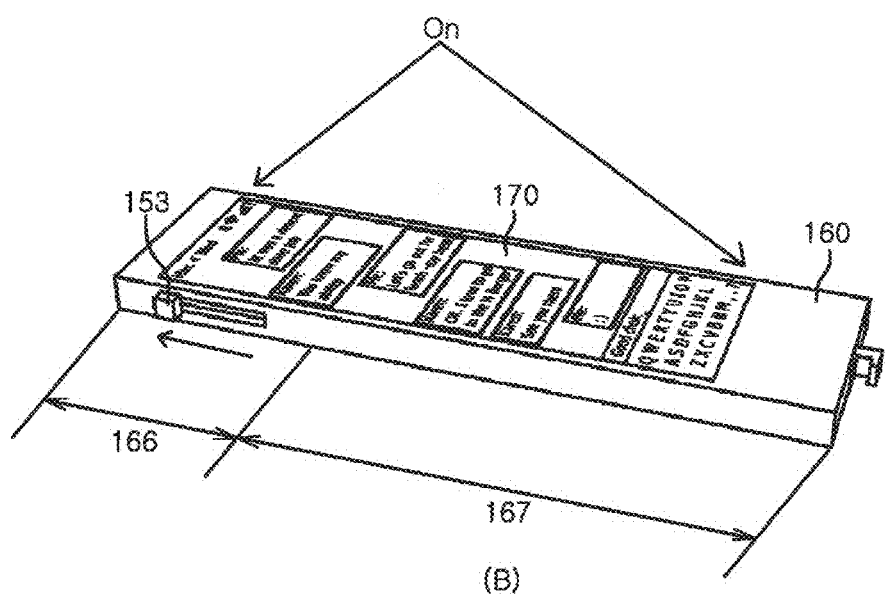

FIGS. 13A and 13B are views for explaining a further implementation form of a flexible device according to an embodiment of the present invention. The flexible device 100 according to an embodiment of the present invention is not necessarily implemented as a smart watch, but may be implemented as a wearable phone as shown in FIGS. 13A and 13B.

According to the flexible device 100 shown in FIG. 13A, the wire 110, the movable members 120, the stopper 130 and the blocking member 140 may be mounted inside a flexible body 160. Even in the embodiment shown in FIG. 13A, the bending of the body 160 may be suppressed by pulling the wire 110 and reducing the distance between the stopper 130 and the blocking member 140. An operation member 153 may be provided on the side surface of the body 160, and the wire 110 may be pulled or loosened by moving the operating member 153. The flexible device 170 may be attached to the surface of the body 160 as shown in FIG. 13A.

According to FIG. 13B, the upper portion 166 of the body 160 of the flexible device 100 may be present in a state in which the bending thereof is always suppressed by a separate hard member (not shown) provided inside the body 160. In contrast, the bendability of the lower portion 167 of the body 160 may be adjusted by the action of the wire 110, the movable members 120, the stopper 130 and the blocking member 140 mounted therein.

In the state where the lower portion 167 can be freely bent as shown in (A) of FIG. 13B, only the portion of the flexible display 170 located on the upper portion 166 may be turned on. Alternatively, in the state where the bending of the lower portion 167 is suppressed by the operation of the operating member 153 as shown in (B) of FIG. 13B, the entire region of the flexible display 170 may be maintained in a straightened state without being bent. Accordingly, the flexible display 170 may operate as a single perfect display with the entire region thereof turned on. With this function, the convenience of the flexible device 100 may be further improved.

ON/OFF of the flexible display 170 is not the only one controlled by the bendability of the flexible display 170. Other various functions may be activated or deactivated depending on the bendability of the flexible display 170. For example, when a text message is received by the flexible device 100, a dialog window and a character input keyboard for responding to the text message received through the flexible device 100 may be outputted to the flexible display 170 only by switching the flexible display 170 to an unbendable state.

The explanation as set forth above is merely described a technical idea of the exemplary embodiments of the present invention, and it will be understood by those skilled in the art to which the present invention belongs that various changes and modifications is made without departing from the scope and spirit of the claimed invention as disclosed in the accompanying claims. Therefore, the exemplary embodiments disclosed herein are not used to limit the technical idea of the present invention, but to explain the present invention. The scope of the claimed invention is to be determined by not only the following claims but also their equivalents. Specific terms used in the present disclosure and drawings are used for illustrative purposes and not to be considered as limitations of the present invention. Therefore, the scope of the claimed invention is construed as defined in the following claims and changes, modifications and equivalents that fall within the technical idea of the present invention are intended to be embraced by the scope of the claimed invention.

What is claimed is:

1. A rigidifiable flexible device, comprising:
   a main body;
   a flexible wire having flexibility;
   a plurality of movable members arranged in a line on a path between one end and the other end of the flexible wire along a longitudinal direction of the flexible wire, the movable members being movable on the path;
   a stopper provided at the one end of the flexible wire and configured to prevent the movable members from being removed from the path beyond the one end of the flexible wire; and
   a blocking member provided at a side where the main body is provided and configured to prevent the movable members from being removed from the path beyond the other end of the flexible wire,
   wherein a length of a portion of the path between the blocking member and the stopper is increasable so that the movable members become far away from each other on the path and the length is decreasable up to a state where the movable members are brought into close contact with each other on the path to form an integrated support body,
   wherein the blocking member has a passage through which the flexible wire extends and is configured to prevent the movable members from moving toward the other end of the flexible wire through the passage,
   wherein the rigidifiable flexible device further comprises a position adjusting member provided at the other end of the flexible wire, and the position adjusting member is prevented from passing through the passage of the blocking member, and
   wherein the position adjusting member is moved along a predetermined second path starting from the passage of the blocking member and ending in the main body of the rigidifiable flexible device to increase or decrease the length of the portion of the flexible wire between the stopper and the blocking member.

2. The device of claim 1, wherein each of the movable members has a through hole through which the flexible wire extends, the movable members being movable along the flexible wire, and the stopper is provided at the one end of the flexible wire, the stopper having such a size that the stopper cannot pass through the through hole of each of the movable members.

3. The rigidifiable flexible device of claim 2, wherein the length of the flexible wire is longer than a length obtained by adding the length of the passage to the sum of the lengths of the through holes of the movable members.

4. The rigidifiable flexible device of claim 3, wherein a portion of the flexible wire between the stopper and the blocking member has a straight shape when the support body makes close contact with the stopper and the blocking member.

5. The rigidifiable flexible device of claim 3, wherein each of the stopper, the blocking member and the movable members has a concavo-convex shape so that the movable members are engageable with each other, the blocking member is engageable with one of the movable members adjacent to the blocking member, and the stopper is engageable with one of the movable members adjacent to the stopper.

6. The rigidifiable flexible device of claim 3, further comprising:
   a second wire having one end attached to the stopper; and
   a plurality of second movable members arranged in a line on the second wire and configured to be movable along the second wire, each of the second movable members having a through hole with such a diameter that the stopper cannot pass through the through hole, the second wire extending through the through hole,
   wherein the blocking member has a second passage through which the second wire extends and is configured to prevent the second movable members from moving toward the other end of the second wire through the second passage.

7. The rigidifiable flexible device of claim 3, wherein the stopper is attached to the blocking member.

8. The rigidifiable flexible device of claim 3, further comprising: a connecting member configured to connect adjacent movable members so that the gap between the adjacent movable members does not exceed a predetermined threshold gap.

9. The rigidifiable flexible device of claim 3, further comprising:
   a flexible body having one end attached to the blocking member and extending away from the blocking member to accommodate the flexible wire, the movable members and the stopper therein.

10. The rigidifiable flexible device of claim 9, further comprising:
    a curvature adjustment portion attached to the blocking member and accommodated in the flexible body to extend in a longitudinal direction of the flexible body from the blocking member, the curvature adjustment portion configured to prevent the flexible body from being bent beyond a predetermined threshold curvature.

11. The rigidifiable flexible device of claim 10, wherein the curvature adjustment portion includes a plurality of unit members coupled to each other in a row, and an arc formed by connecting centers of the unit members is maintained so as not to exceed the predetermined threshold curvature.

12. The rigidifiable flexible device of claim 9, wherein the flexible body includes a rigid fixing member provided at the other end of the flexible body, and an elastic member accommodated in the flexible body and having one end attached to the fixing member and the other end attached to the stopper, and the elastic member, in a state in which the support body is making close contact with the stopper and the blocking member, is configured to apply a restoring force acting in a direction toward the fixing member to the stopper.

13. The rigidifiable flexible device of claim 9, wherein the flexible body includes a rigid fixing member provided at the other end of the flexible body, and one or more rigid curvature preventing portions accommodated in the flexible body and configured to prevent the flexible body from being bent, each of the curvature preventing portions having one end attached to the fixing member and the other end attached to the stopper.

14. The rigidifiable flexible device of claim 13, wherein each of the curvature preventing portions includes a plurality of rod-shaped frames coupled to each other in a row, and the adjacent frames are coupled to each other by a joint passing through the adjacent frames to be rotatable about the joint.

15. The rigidifiable flexible device of claim 9, further comprising:

a non-moving member fixed at a predetermined position in the flexible body and having a through hole through which the flexible wire extends, the through hole having such a size that the movable members cannot pass through the through hole; and a second stopper fixed at a predetermined position on the flexible wire between the blocking member and the non-moving member, the second stopper having such a size that the second stopper cannot pass through the through holes of the movable members and the through hole of the non-moving member, wherein some of the movable members are present between the blocking member and the second stopper on the flexible wire, and the remaining movable members are present between the non-moving member and the stopper on the flexible wire.

16. The rigidifiable flexible device of claim 15, wherein the through hole of the non-moving member is formed in a semicircular shape so that both ends of the through hole face the blocking member.

17. The rigidifiable flexible device of claim 9, further comprising:

a flexible linear rail member mounted inside the flexible body and configured to guide movement of one of the movable members, the stopper and the blocking member.

18. The rigidifiable flexible device of claim 9, wherein a flexible display is attached to an outer surface of the flexible body, and the flexible device is configured to turn on the flexible display or to activate a predetermined function of the flexible device when the support body is brought into close contact with the stopper and the blocking member.

19. The rigidifiable flexible device of claim 9, wherein the rigidifiable flexible device has a wireless communication function, and the rigidifiable flexible device is switched to a state in which a telephone conversation according to a call request is feasible when the support body is brought into close contact with the stopper and the blocking member at the time of receiving the call request.

20. The rigidifiable flexible device of claim 19, further comprising:

a voice output unit configured to output a voice transmitted to the rigidifiable flexible device through the telephone conversation; and a voice input unit configured to receive a voice to be transmitted to a communication terminal that has made the call request through the telephone conversation, wherein positions of the voice output unit and the voice input unit on the rigidifiable flexible device are determined such that the voice output unit and the voice input unit are spaced apart from each other by a predetermined distance or more in a state in which the support body is making close contact with the stopper and the blocking member.

21. A rigidifiable flexible device, comprising:

a flexible member having flexibility;

a plurality of movable members arranged in a line on a path between one end and the other end of the flexible member along a longitudinal direction of the flexible member, the movable members being movable on the path;

a stopper provided at the one end of the flexible member and configured to prevent the movable members from being removed from the path beyond the one end of the flexible member; and a blocking member configured to prevent the movable members from being removed from the path beyond the other end of the flexible member, wherein a length of a portion of the path between the blocking member and the stopper is adjustable so that the movable members are brought into close contact with each other on the path to form an integrated support body, wherein the blocking member is moved or extended toward the stopper on the path so that the support body is brought into close contact with the blocking member and the stopper, and wherein the flexible member is rigidifiable according to a movement or extension of the blocking member.

22. The rigidifiable flexible device of claim 21, wherein the rigidifiable flexible device has a wireless communication function, and the rigidifiable flexible device is switched to a state in which a telephone conversation according to a call request is feasible when the support body is brought into close contact with the stopper and the blocking member at the time of receiving the call request.

23. The rigidifiable flexible device of claim 22, further comprising:

a voice output unit configured to output a voice transmitted to the rigidifiable flexible device through the telephone conversation; and a voice input unit configured to receive a voice to be transmitted to a communication terminal that has made the call request through the telephone conversation, wherein positions of the voice output unit and the voice input unit on the rigidifiable flexible device are determined such that the voice output unit and the voice input unit are spaced apart from each other by a predetermined distance or more in a state in which the support body is making close contact with the stopper and the blocking member.

24. A rigidifiable flexible device, comprising:
a flexible member having flexibility;
a plurality of movable members arranged in a line on a path between one end and the other end of the flexible member along a longitudinal direction of the flexible member, the movable members being movable on the path;
a stopper provided at the one end of the flexible member and configured to prevent the movable members from being removed from the path beyond the one end of the flexible member; and
a blocking member configured to prevent the movable members from being removed from the path beyond the other end of the flexible member,
wherein the length of a portion of the path between the blocking member and the stopper is adjustable so that the movable members are brought into close contact with each other on the path to form an integrated support body,
wherein the flexible member is formed in a tube shape having an internal space,
the internal space of the flexible member is provided as a path through which the movable members is movable, and
the blocking member is configured to apply a pushing force acting in a direction toward the stopper to the movable members so that the movable members form the support body.

25. The rigidifiable flexible device of claim 24, wherein a through hole parallel to the path is formed in each of the movable members.

26. The rigidifiable flexible device of claim 24, wherein the rigidifiable flexible device has a wireless communication function, and the rigidifiable flexible device is switched to a state in which a telephone conversation according to a call request is feasible when the support body is brought into close contact with the stopper and the blocking member at the time of receiving the call request.

27. The rigidifiable flexible device of claim 26, further comprising:
a voice output unit configured to output a voice transmitted to the rigidifiable flexible device through the telephone conversation; and
a voice input unit configured to receive a voice to be transmitted to a communication terminal that has made the call request through the telephone conversation,
wherein positions of the voice output unit and the voice input unit on the rigidifiable flexible device are determined such that the voice output unit and the voice input unit are spaced apart from each other by a predetermined distance or more in a state in which the support body is making close contact with the stopper and the blocking member.

28. The rigidifiable flexible device of claim 1, wherein the position adjusting member is fixed at a predetermined position on the second path to maintain a state in which the support body makes close contact with the stopper and the blocking member.

29. The rigidifiable flexible device of claim 1, further comprising:
a pawl located at a predetermined position on the second path and configured to prevent the position adjusting member from moving through the predetermined position toward the passage on the second path and to allow the position adjusting member to move through the predetermined position away from the passage on the second path.

* * * * *